(12) United States Patent
Tsutsumi

(10) Patent No.: US 10,903,232 B2
(45) Date of Patent: Jan. 26, 2021

(54) THREE-DIMENSIONAL MEMORY DEVICES CONTAINING MEMORY STACK STRUCTURES WITH LATERALLY SEPARATED CHARGE STORAGE ELEMENTS AND METHOD OF MAKING THEREOF

(71) Applicant: SANDISK TECHNOLOGIES LLC, Addison, TX (US)

(72) Inventor: Masanori Tsutsumi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/273,393

(22) Filed: Feb. 12, 2019

(65) Prior Publication Data
US 2019/0252405 A1  Aug. 15, 2019

Related U.S. Application Data

(60) Provisional application No. 62/630,408, filed on Feb. 14, 2018.

(51) Int. Cl.
*H01L 27/11582* (2017.01)
*H01L 27/11565* (2017.01)
(Continued)

(52) U.S. Cl.
CPC .... *H01L 27/11582* (2013.01); *G11C 16/0466* (2013.01); *H01L 27/1157* (2013.01);
(Continued)

(58) Field of Classification Search
CPC ........... H01L 27/11582; H01L 27/1157; H01L 29/40117; H01L 29/5926; H01L 27/11565; H01L 29/0649
(Continued)

(56) References Cited

U.S. PATENT DOCUMENTS 5,915,167 A   6/1999 Leedy
9,620,514 B2  4/2017 Kai et al.
(Continued)

OTHER PUBLICATIONS

Lue, H.T., et al., A 128Gb (MLC)/192Gb (TLC) Single-Gate Vertical Channel (SGVC) Architecture 3D NAND using only 16 Layers with Robust Read Disturb, Long-Retention and Excellent Scaling Capability, IEDM Proceedings, p. 461, Dec. 2 to 6, 2017.
(Continued)

*Primary Examiner* — Mohammed Shamsuzzaman
*Assistant Examiner* — Aaron J Gray
(74) *Attorney, Agent, or Firm* — The Marbury Law Group, PLLC

(57) ABSTRACT

Laterally alternating sequences of memory opening fill structures and isolation dielectric pillars are formed between alternating stacks of insulating layers and sacrificial material layers. Each of the memory opening fill structures includes, from inside to outside, a vertical semiconductor channel, a tunneling dielectric layer, and an aluminum oxide liner. Backside recesses are formed by removing the sacrificial material layers selective to the insulating layers. Discrete silicon nitride portions are formed on physically exposed surfaces of the aluminum oxide liners employing a selective silicon nitride deposition process, and are employed as charge storage elements. Electrically conductive layers are formed in remaining volumes of the backside recesses. The silicon nitride portions are formed as a pair of discrete silicon nitride portions at each level of the electrically conductive layers within each memory opening fill structure.

18 Claims, 34 Drawing Sheets

(51) Int. Cl.
*H01L 27/1157* (2017.01)
*H01L 29/06* (2006.01)
*G11C 16/04* (2006.01)
*H01L 21/28* (2006.01)

(52) U.S. Cl.
CPC .... *H01L 27/11565* (2013.01); *H01L 29/0649* (2013.01); *G11C 16/0483* (2013.01); *H01L 29/40117* (2019.08)

(58) Field of Classification Search
USPC ......... 257/324, 325, 326, E29.309; 438/591, 438/264
See application file for complete search history.

(56) References Cited

U.S. PATENT DOCUMENTS

| | | |
|---|---|---|
| 9,627,399 B2 | 4/2017 | Kanakamedala et al. |
| 9,666,594 B2 | 5/2017 | Mizumo et al. |
| 9,728,546 B2 | 8/2017 | Serov et al. |
| 9,812,463 B2 | 11/2017 | Sharangpani et al. |
| 9,837,431 B2 | 12/2017 | Nishikawa et al. |
| 9,991,277 B1 | 6/2018 | Tsutsumi et al. |
| 10,115,732 B2 | 10/2018 | Yu et al. |
| 2012/0001252 A1* | 1/2012 | Alsmeier ............... H01L 29/788 257/321 |
| 2014/0073099 A1* | 3/2014 | Park .................. H01L 27/11556 438/268 |
| 2015/0325589 A1* | 11/2015 | Hopkins ............. H01L 21/0217 438/257 |
| 2016/0071860 A1 | 3/2016 | Kai et al. |
| 2016/0071861 A1 | 3/2016 | Serov et al. |
| 2016/0071876 A1 | 3/2016 | Mizuno et al. |
| 2017/0025431 A1 | 1/2017 | Kanakamedala et al. |
| 2017/0148805 A1 | 5/2017 | Nishikawa et al. |
| 2017/0243879 A1 | 8/2017 | Yu et al. |
| 2017/0278859 A1 | 9/2017 | Sharangpani et al. |
| 2018/0040623 A1 | 2/2018 | Kanakamedala et al. |
| 2018/0040627 A1* | 2/2018 | Kanakamedala ............................ H01L 27/11529 |
| 2018/0151588 A1 | 5/2018 | Tsutsumi et al. |

OTHER PUBLICATIONS

Lin, Y.H. et al., "Work Function Adjustment by Using Dipole Engineering for TaN—Al2O3—Si3N4—HfSiOx-Silicon Nonvolatile Memory," Materials 2015, 8, pp. 5112-5120, (2015).

* cited by examiner

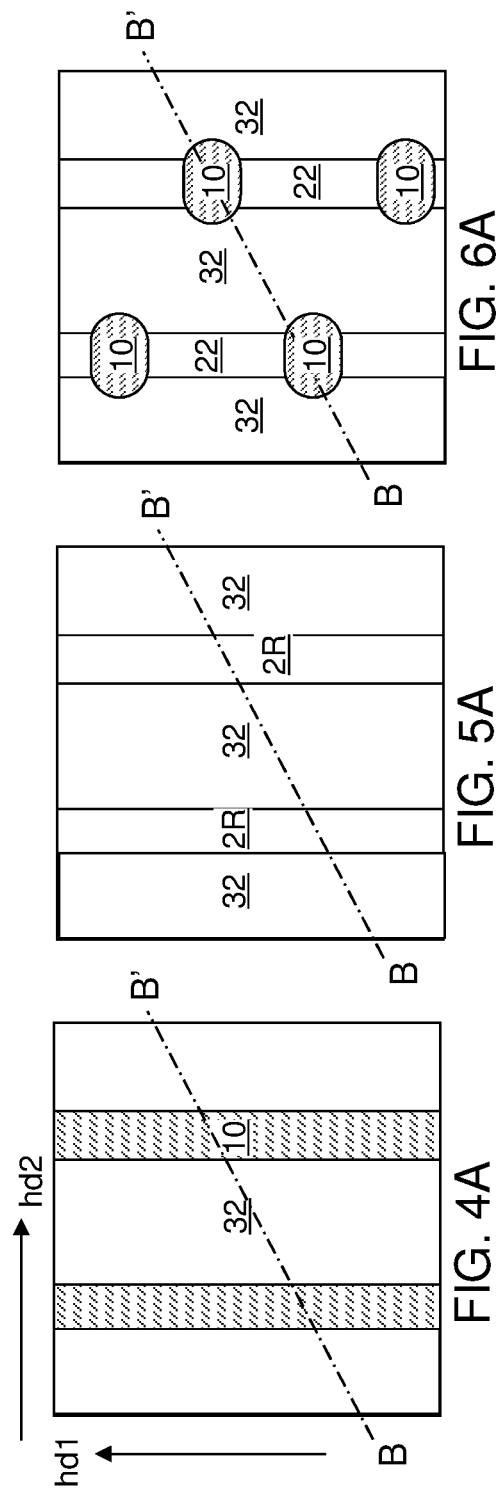

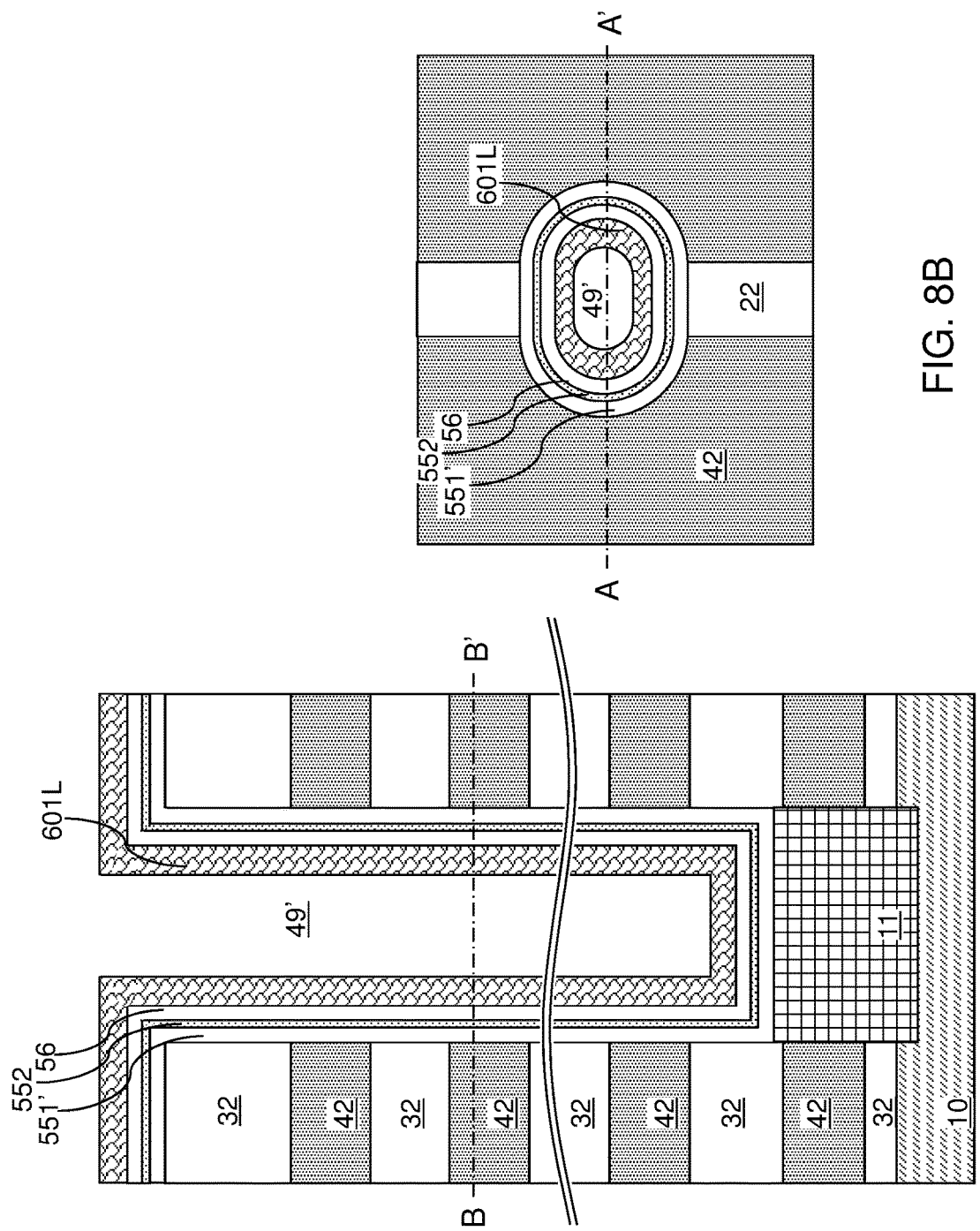

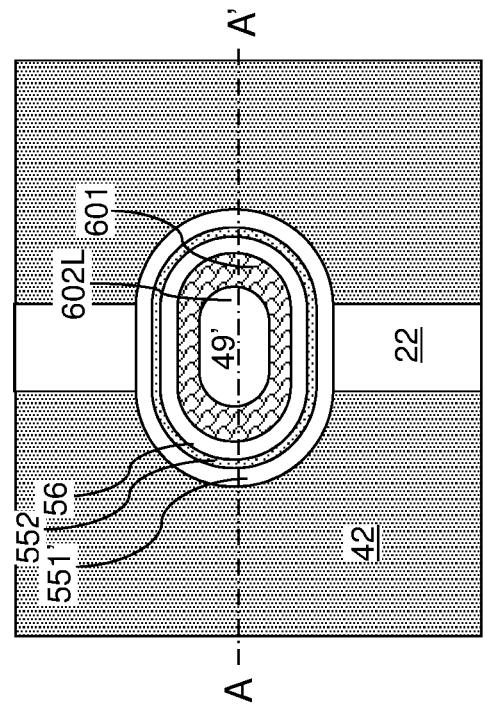
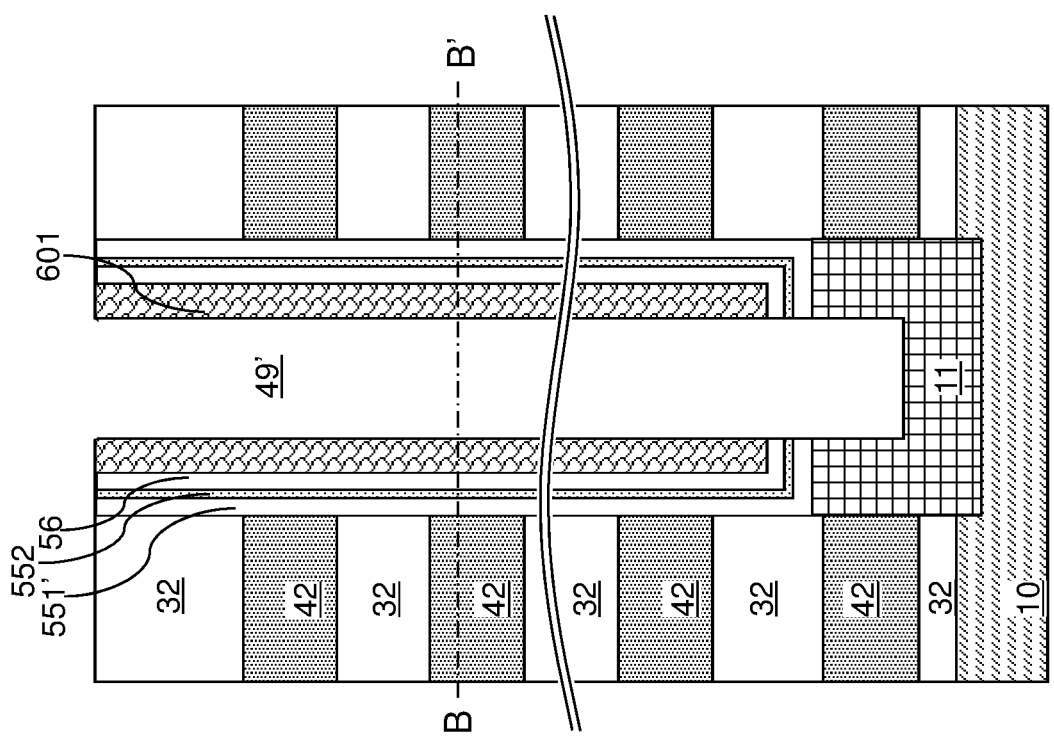
FIG. 9B
FIG. 9A

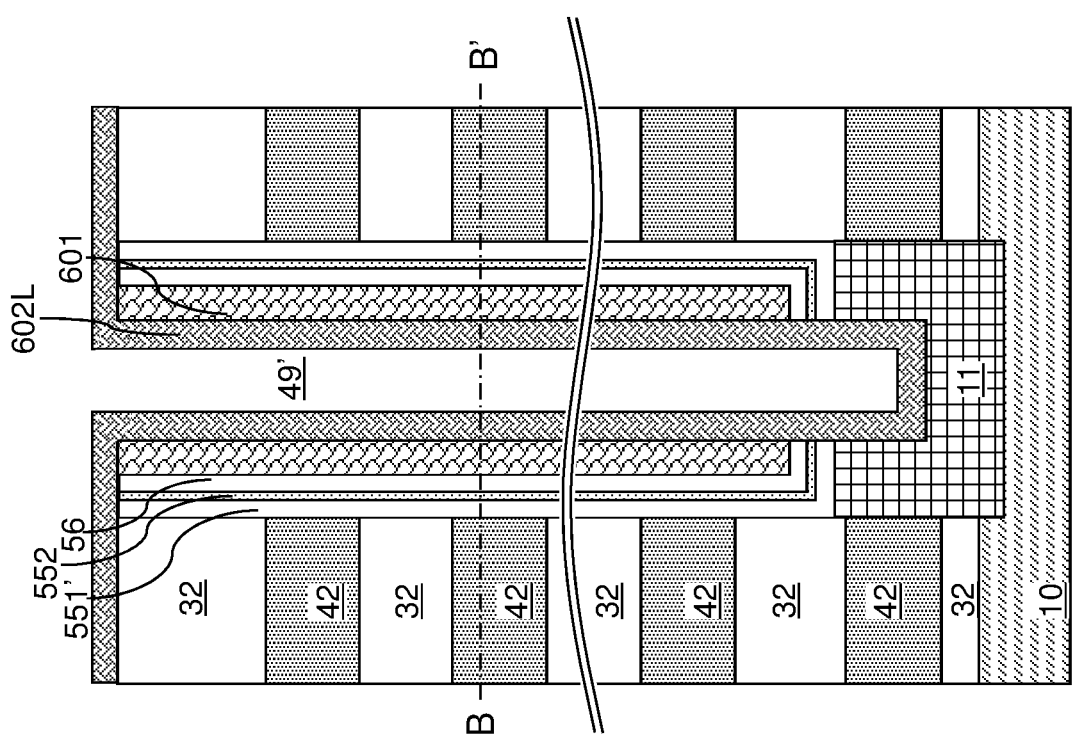
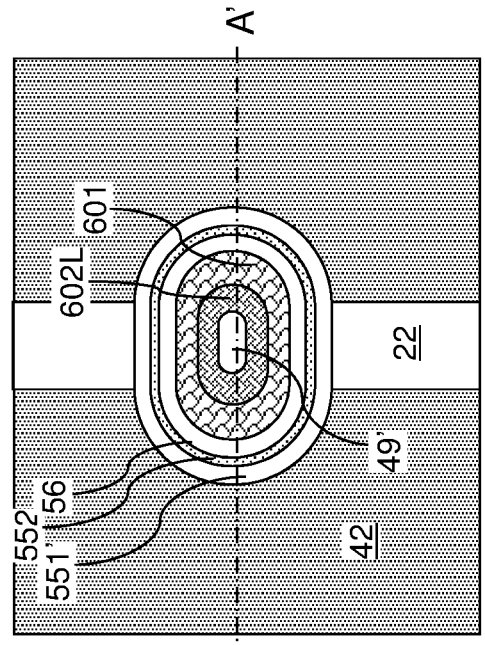
FIG. 10A
FIG. 10B

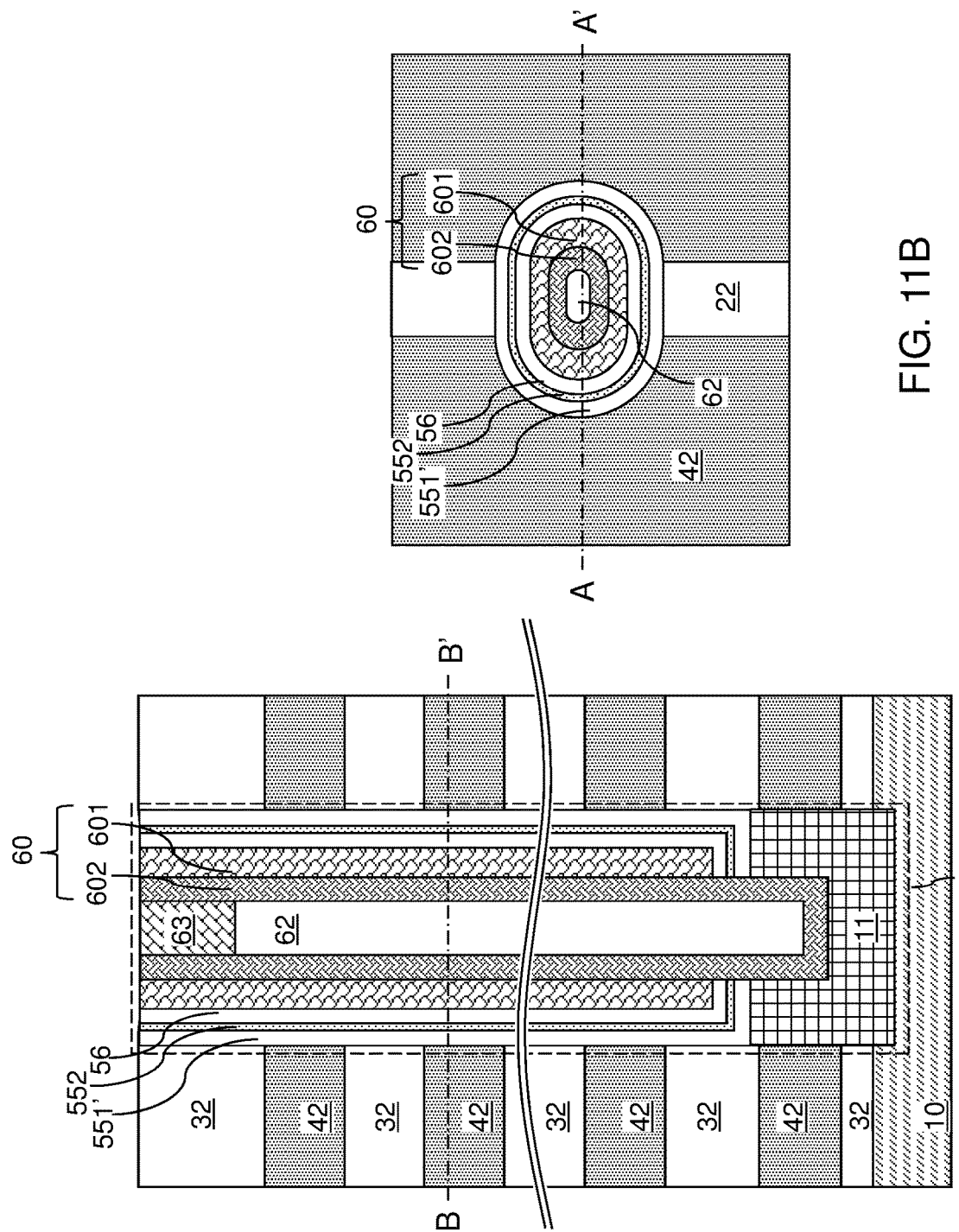

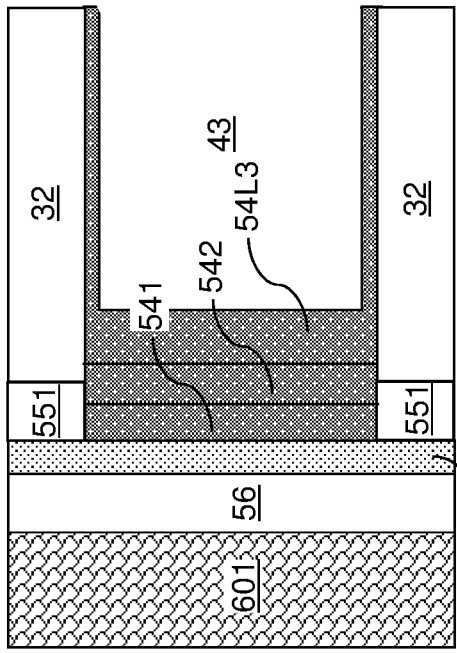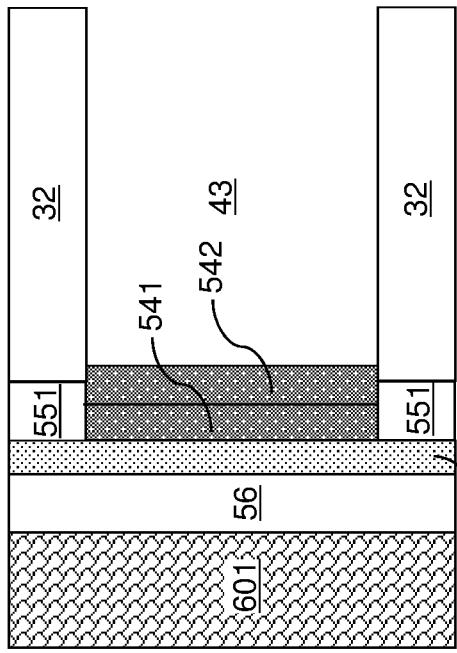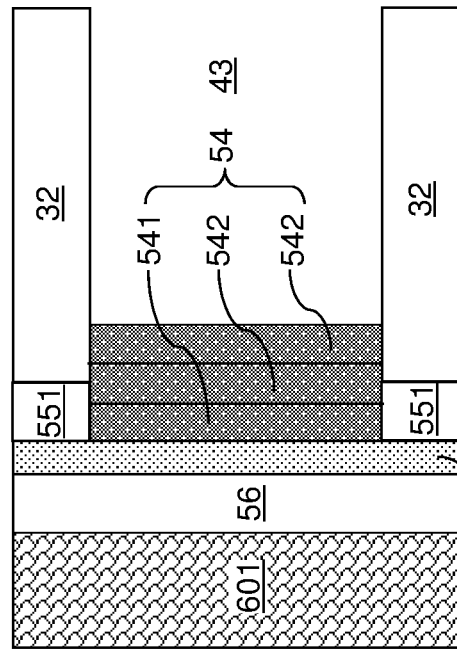

THREE-DIMENSIONAL MEMORY DEVICES CONTAINING MEMORY STACK STRUCTURES WITH LATERALLY SEPARATED CHARGE STORAGE ELEMENTS AND METHOD OF MAKING THEREOF

RELATED APPLICATIONS

The present application claims the benefit of priority from U.S. Provisional Application Ser. No. 62/630,408 filed on Feb. 14, 2018, the entire contents of which are incorporated herein by reference.

FIELD

The present disclosure relates generally to the field of semiconductor devices and specifically to three-dimensional memory devices containing laterally and vertically separated discrete charge storage elements within a memory opening and methods of making the same.

BACKGROUND

Recently, ultra high density storage devices have been proposed using a three-dimensional (3D) stacked memory stack structure sometimes referred to as a Bit Cost Scalable (BiCS) architecture. For example, a 3D NAND stacked memory device can be formed from an array of alternating conductive and dielectric layers. A memory opening is formed through the layers to define many memory layers simultaneously. A NAND memory stack structure containing a memory film and a semiconductor channel is then formed by filling the memory opening with appropriate materials. Control gates/word lines of the memory cells may be provided by the conductive layers.

SUMMARY

According to an aspect of the present disclosure, a three-dimensional memory device is provided, which comprises: a first vertically alternating stack of first insulating layers and first electrically conductive layers located over a substrate; a second vertically alternating stack of second insulating layers and second electrically conductive layers located over the substrate and laterally spaced apart from, and is adjacent to, the first vertically alternating stack; and a laterally alternating sequence of memory opening fill structures and isolation dielectric pillars located between the first vertically alternating stack and the second vertically alternating stack, wherein: each of the memory opening fill structures comprises, from inside to outside, a vertical semiconductor channel, a tunneling dielectric layer, an aluminum oxide liner, and two vertical stacks of discrete silicon nitride portions; and each pair of discrete silicon nitride portions located at a same height from the substrate and included in the two vertical stacks of discrete silicon nitride portions is vertically spaced apart from all other pairs of discrete silicon nitride portions within a respective memory opening fill structure.

According to another aspect of the present disclosure, a three-dimensional memory device is provided, which comprises: alternating stacks of insulating layers and electrically conductive layers laterally spaced apart and located over a substrate; and laterally alternating sequences of memory stack structures and separator structures located between each laterally neighboring pair of the alternating stacks. Each of the memory stack structures comprises, from inside to outside, a vertical semiconductor channel, a tunneling dielectric, an aluminum oxide liner, and two vertical stacks of discrete charge trap silicon nitride portions. Each pair of discrete charge trap silicon nitride portions located at a same height from the substrate is vertically spaced from other pairs of discrete charge trap silicon nitride portions and does not directly contact each other. A backside blocking dielectric layer is disposed between each adjacent pair of discrete charge trap silicon nitride portions and an electrically conductive layer.

According to another aspect of the present disclosure, a method of forming a three-dimensional memory device is provided, which comprises: forming a vertically alternating sequence of continuous insulating layers and continuous sacrificial material layers over a substrate; forming laterally alternating sequences of memory opening fill structures and isolation dielectric pillars through the vertically alternating sequence, wherein remaining portions of the vertically alternating sequence include alternating stacks of insulating layers and sacrificial material layers laterally spaced apart by the laterally alternating sequences, and wherein each of the memory opening fill structures comprises, from inside to outside, a vertical semiconductor channel, a tunneling dielectric layer, and an aluminum oxide liner; forming backside recesses by removing the sacrificial material layers selective to the insulating layers; forming discrete silicon nitride portions on physically exposed surfaces of the aluminum oxide liners employing a selective silicon nitride deposition process; and forming electrically conductive layers in remaining volumes of the backside recesses.

BRIEF DESCRIPTION OF THE DRAWINGS

FIG. 4A is a top-down view of an exemplary device structure after formation of isolation trenches according to an embodiment of the present disclosure.

FIG. 4B is a vertical cross-sectional view of the exemplary device structure along the vertical plane B-B' of FIG. 4A.

FIG. 5A is a top-down view of the exemplary device structure after formation of isolation dielectric rails according to the embodiment of the present disclosure.

FIG. 5B is a vertical cross-sectional view of the exemplary device structure along the vertical plane B-B' of FIG. 5A.

FIG. 6A is a top-down view of the exemplary device structure after formation of memory openings according to the embodiment of the present disclosure.

FIG. 6B is a vertical cross-sectional view of the exemplary device structure along the vertical plane B-B' of FIG. 6A.

FIG. 8A is a vertical cross-sectional view of a memory opening after formation of a silicon oxide liner, an aluminum oxide liner, a tunneling dielectric layer, and a first semiconductor channel material layer according to an embodiment of the present disclosure.

FIG. 8B is a horizontal cross-sectional view along the plane B-B' of FIG. 8A. The vertical cross-sectional plane A-A' is the plane of the vertical cross-sectional view of FIG. 8A.

FIG. 9A is a vertical cross-sectional view of a memory opening after removing horizontal portions of the silicon oxide liner, the aluminum oxide liner, the tunneling dielectric layer, and the first semiconductor channel material layer by an anisotropic etch according to an embodiment of the present disclosure.

FIG. 9B is a horizontal cross-sectional view along the plane B-B' of FIG. 9A. The vertical cross-sectional plane A-A' is the plane of the vertical cross-sectional view of FIG. 9A.

FIG. 10A is a vertical cross-sectional view of a memory opening after deposition of a second semiconductor channel material layer according to an embodiment of the present disclosure.

FIG. 10B is a horizontal cross-sectional view along the plane B-B' of FIG. 10A. The vertical cross-sectional plane A-A' is the plane of the vertical cross-sectional view of FIG. 10A.

FIG. 11A is a vertical cross-sectional view of a memory opening after formation of a dielectric core and a drain region according to an embodiment of the present disclosure.

FIG. 11B is a horizontal cross-sectional view along the plane B-B' of FIG. 11A. The vertical cross-sectional plane A-A' is the plane of the vertical cross-sectional view of FIG. 11A.

FIGS. 17A-17G illustrate a region around a backside recess during formation of a discrete silicon nitride portion during the processing steps of FIGS. 16A and 16B.

DETAILED DESCRIPTION

Figure 1:
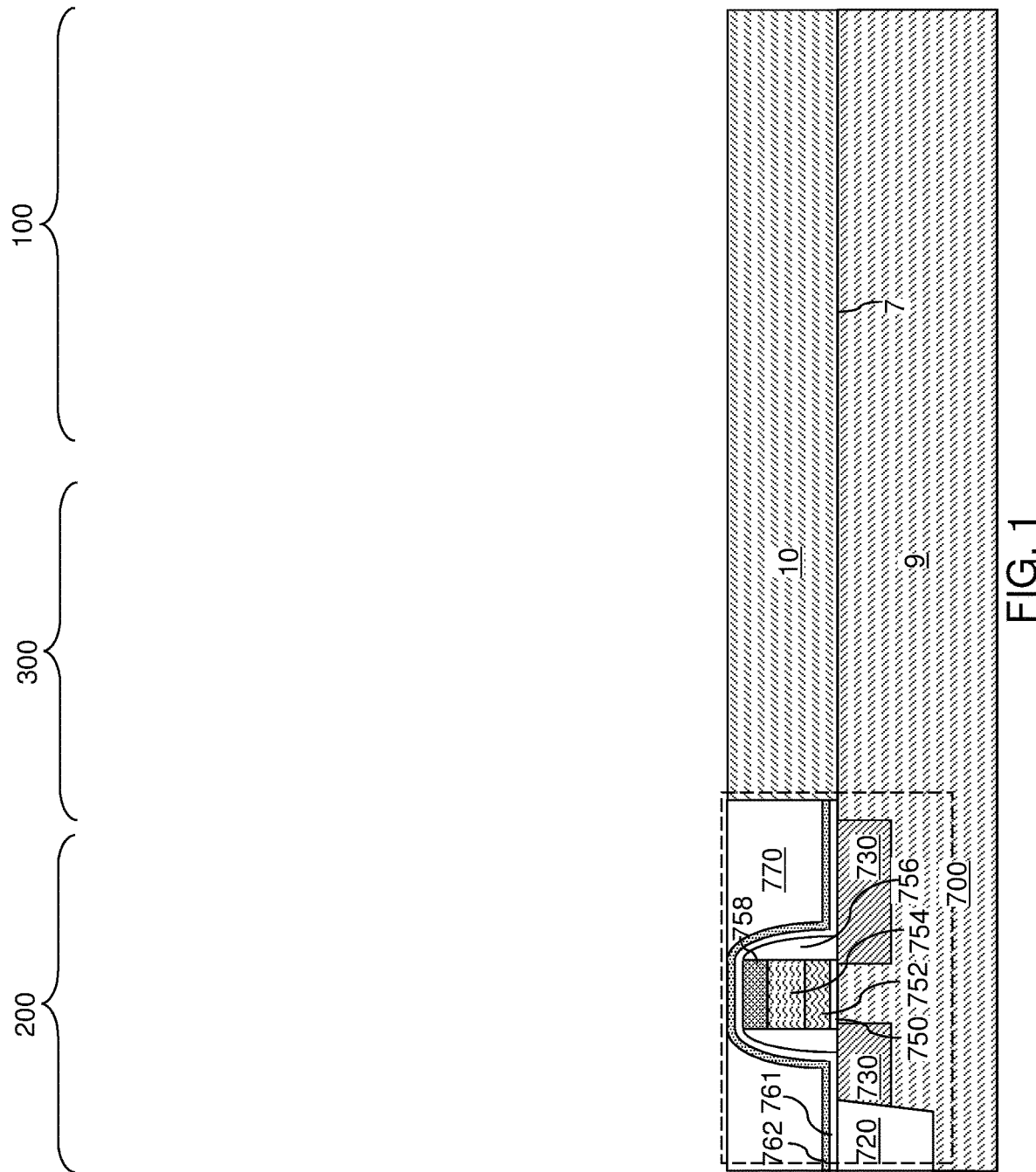
FIG. 1 is a schematic vertical cross-sectional view of an exemplary structure after formation of at least one peripheral device and a semiconductor material layer according to an embodiment of the present disclosure.

As discussed above, the present disclosure is directed to three-dimensional memory devices containing laterally and vertically separated discrete charge storage elements within a memory opening and methods of making the same, the various aspects of which are described below. The embodiments of the disclosure can be employed to form various semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^{5}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^{5}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
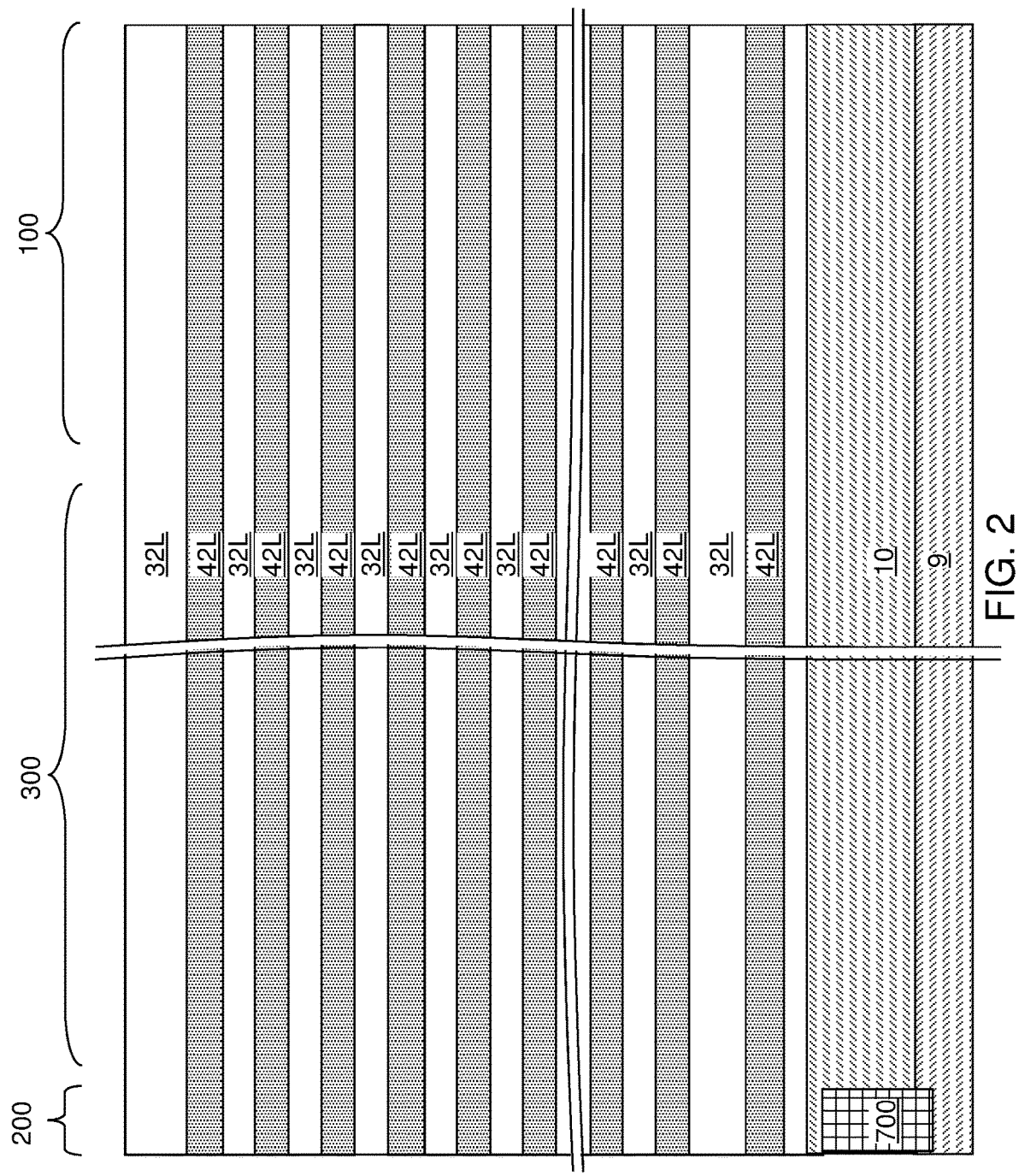
FIG. 2 is a schematic vertical cross-sectional view of the exemplary structure after formation of a vertically alternating sequence of continuous insulating layers and continuous sacrificial material layers over the substrate according to an embodiment of the present disclosure.

Referring to FIG. 2, a vertically alternating sequence of continuous insulating layers 32L and continuous sacrificial material layers 42L is formed over the substrate (9, 10). In one embodiment, the topmost continuous insulating layer 32L are composed of a first material, and the continuous sacrificial material layers 42L are composed of a second material different from that of continuous insulating layers 32L. The first material of the continuous insulating layers 32L can be at least one insulating material. As such, each continuous insulating layer 32L can be an insulating material layer. Insulating materials that can be employed for the continuous insulating layers 32L include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the continuous insulating layers 32L can be silicon oxide.

The second material of the continuous sacrificial material layers 42L is a sacrificial material that can be removed selective to the first material of the continuous insulating layers 32L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The continuous sacrificial material layers 42L may comprise an insulating material, a semiconductor material, or a conductive material. The second material of the continuous sacrificial material layers 42L can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the continuous sacrificial material layers 42L can be spacer material layers that comprise silicon nitride or a semiconductor material including at least one of silicon and germanium.

In one embodiment, the continuous insulating layers 32L can include silicon oxide, and sacrificial material layers can include silicon nitride sacrificial material layers. The first material of the continuous insulating layers 32L can be deposited, for example, by chemical vapor deposition (CVD). For example, if silicon oxide is employed for the continuous insulating layers 32L, tetraethyl orthosilicate (TEOS) can be employed as the precursor material for the CVD process. The second material of the continuous sacrificial material layers 42L can be formed, for example, CVD or atomic layer deposition (ALD).

The continuous sacrificial material layers 42L can be suitably patterned so that conductive material portions to be subsequently formed by replacement of the continuous sacrificial material layers 42L can function as electrically conductive electrodes, such as the control gate electrodes of the monolithic three-dimensional NAND string memory devices to be subsequently formed. The continuous sacrificial material layers 42L may comprise a portion having a strip shape extending substantially parallel to the major surface 7 of the substrate.

The thicknesses of the continuous insulating layers 32L and the continuous sacrificial material layers 42L can be in a range from 20 nm to 50 nm, although lesser and greater thicknesses can be employed for each continuous insulating layer 32L and for each continuous sacrificial material layer 42L. The number of repetitions of the pairs of a continuous insulating layer 32L and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each continuous sacrificial material layer 42L in the vertically alternating sequence (32L, 42L) can have a uniform thickness that is substantially invariant within each respective continuous sacrificial material layer 42L.

While the present disclosure is described employing an embodiment in which the spacer material layers are continuous sacrificial material layers 42L that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

The topmost continuous insulating layer 32L includes a dielectric material that is different from the material of the continuous sacrificial material layers 42L. In one embodiment, the topmost continuous insulating layer 32L can include a dielectric material that can be employed for the continuous insulating layers 32L as described above. The topmost continuous insulating layer 32L can have a greater thickness than each of the continuous insulating layers 32L. The topmost continuous insulating layer 32L can be deposited, for example, by chemical vapor deposition. In one embodiment, the topmost continuous insulating layer 32L can be a silicon oxide layer.

Figure 3:
FIG. 3 is a schematic vertical cross-sectional view of the exemplary structure after formation of stepped terraces and a retro-stepped dielectric material portion according to an embodiment of the present disclosure.

Referring to FIG. 3, stepped surfaces are formed at a peripheral region of the vertically alternating sequence (32L, 42L), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the vertically alternating sequence (32L, 42L) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each continuous sacrificial material layer 42L other than a topmost continuous sacrificial material layer 42L within the vertically alternating sequence (32L, 42L) laterally extends farther than any overlying continuous sacrificial material layer 42L within the vertically alternating sequence (32L, 42L) in the terrace region. The terrace region includes stepped surfaces of the vertically alternating sequence (32L, 42L) that continuously extend from a bottommost layer within the vertically alternating sequence (32L, 42L) to a topmost layer within the vertically alternating sequence (32L, 42L).

Each vertical step of the stepped surfaces can have the height of one or more pairs of a continuous insulating layer 32L and a continuous sacrificial material layer 42L. In one embodiment, each vertical step can have the height of a single pair of a continuous insulating layer 32L and a continuous sacrificial material layer 42L. In another embodiment, multiple "columns" of staircases can be formed along a first horizontal direction hd1 such that each vertical step has the height of a plurality of pairs of a continuous insulating layer 32L and a continuous sacrificial material layer 42L, and the number of columns can be at least the number of the plurality of pairs. Each column of staircase can be vertically offset among one another such that each of the continuous sacrificial material layers 42L has a physically exposed top surface in a respective column of staircases. In the illustrative example, two columns of staircases are formed for each block of memory stack structures to be subsequently formed such that one column of staircases provide physically exposed top surfaces for odd-numbered continuous sacrificial material layers 42L (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the continuous sacrificial material layers 42L may also be employed. Each continuous sacrificial material layer 42L has a greater lateral extent, at least along one direction, than any overlying continuous sacrificial material layers 42L such that each physically exposed surface of any continuous sacrificial material layer 42L does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the topmost continuous insulating layer 32L, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Referring to FIGS. 4A and 4B, isolation trenches 47 can be formed through the vertically alternating sequence (32L, 42L). The isolation trenches 47 can vertically extend through each layer of the vertically alternating sequence (32L, 42L). The pattern of the isolation trenches 47 can be selected such that the vertically alternating sequence (32L, 42L) are divided into multiple disjoined portions that are laterally spaced among one another by the isolation trenches 47. Each patterned remaining portion of the vertically alternating sequence (32L, 42L) includes a respective alternating stack of insulating layers 32 and sacrificial material layers 42. Each patterned portion of the continuous insulating layer 32L constitutes an insulating layer 32, and each patterned portion of the continuous sacrificial material layer 42L constitutes a sacrificial material later 42. In one embodiment, each of the alternating stacks (32, 42) may be formed with multiple fingers that laterally extend from a plate portion located within the staircase region 300. In one embodiment, the isolation trenches 47 can include lengthwise portions that laterally extend along the first horizontal direction hd1 and connecting portions (not shown in FIG. 4A) that connect the lengthwise portions.

Referring to FIGS. 5A and 5B, a dielectric material such as silicon oxide is deposited in the isolation trenches 47 to form isolation dielectric rails 2R. Horizontal portions of the deposited dielectric material overlying the topmost insulating layers 32 may be removed from above the topmost insulating layers 32. Alternatively, horizontal portions of the deposited dielectric material overlying the topmost insulating layers 32 may be incorporated into the topmost insulating layers 32. Each isolation dielectric rail 2R can have at least two straight sidewalls that are parallel to each other and laterally extend along a local lengthwise direction of a respective isolation trench 47.

Referring to FIGS. 6A, 6B, 7A, and 7B, a lithographic material stack (not shown) including at least a photoresist layer can be formed over the alternating stacks (32, 42) and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the retro-stepped dielectric material portion 65 and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed.

The memory openings 49 are formed through the entirety of the alternating stack (32, 42) in the memory array region 100. The location of each memory opening 49 can be selected such that each memory opening 49 cuts through a respective one of the isolation dielectric rails 2R. In one embodiment, the memory openings 49 can be aligned to the isolation dielectric rails 2R such that the geometrical center of each memory opening 49 is located along a center vertical plane located midway between a pair of lengthwise sidewalls of an adjacent portion of the isolation trenches 47. In one embodiment, the memory openings 49 can be elongated along a direction perpendicular to the lengthwise direction of the isolation dielectric rails 2R. For example, the memory openings 49 can be formed in portions of the isolation dielectric rails 2R that laterally extend along the first horizontal direction hd1, and the memory openings 49 can be elongated along the second horizontal direction hd2. In one embodiment, the ratio of the maximum lateral dimension of each memory opening 49 to the minimum lateral dimension of each memory opening 49 can be in a range from 1.0 to 3.0. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

Figure 7A:
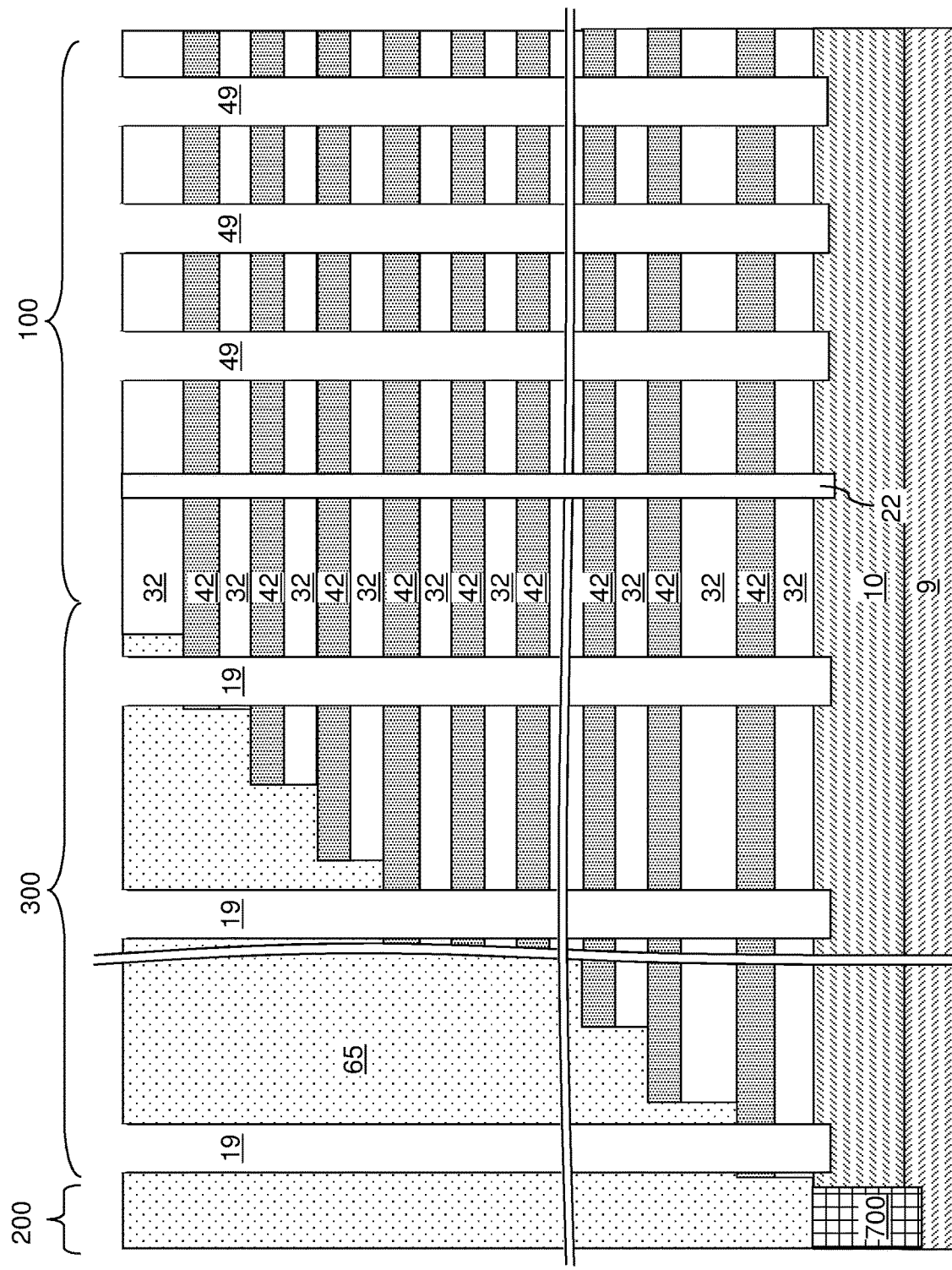
FIG. 7A is another vertical cross-sectional view of the exemplary structure of FIGS. 6A and 6B.
Figure 7B:
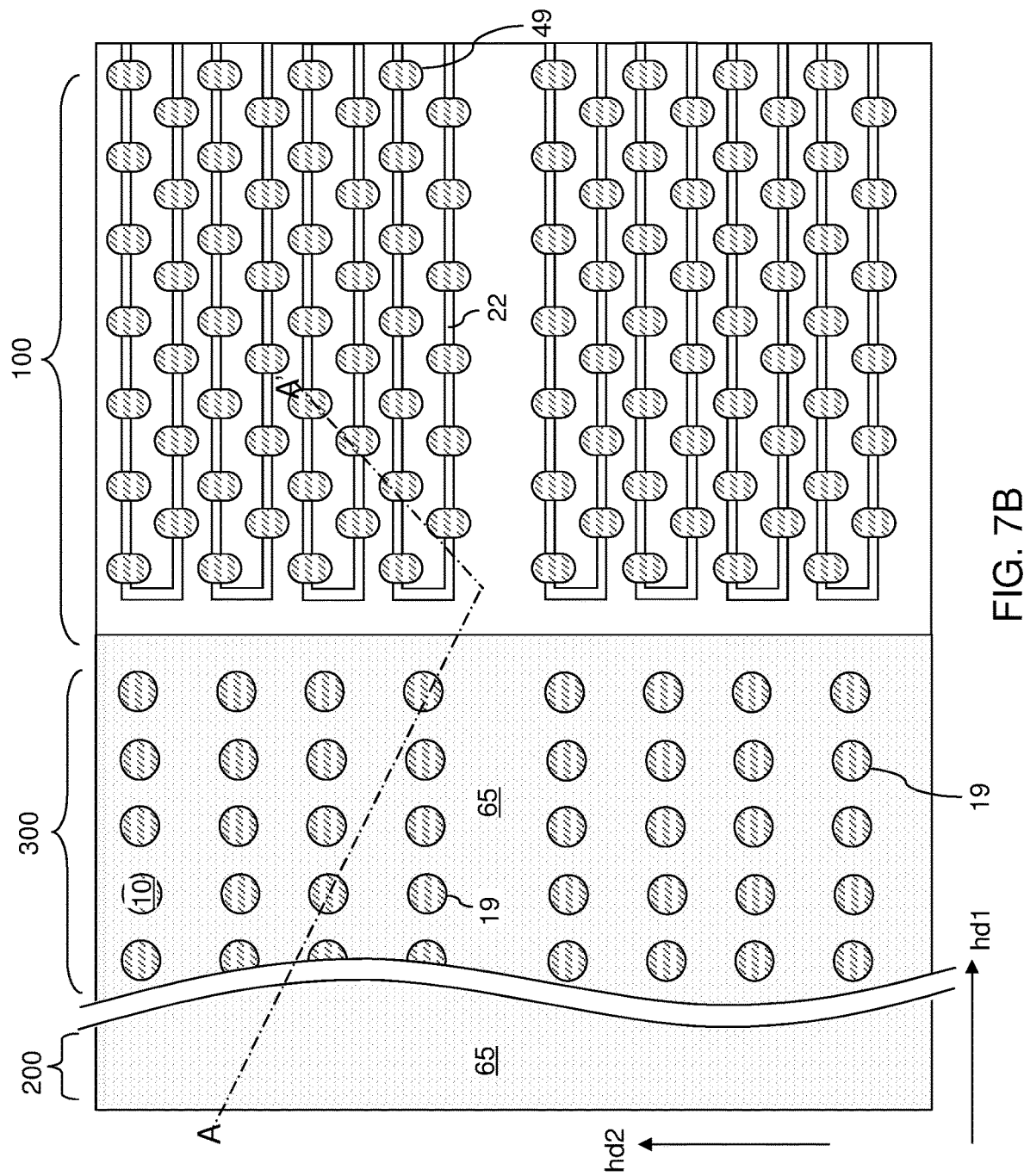
FIG. 7B is a top-down view of the exemplary structure of FIG. 7A. The hinged vertical plane A-A' is the plane of the vertical cross-sectional view of FIG. 7A.

In one embodiment, each of the isolation dielectric rails 2R can be divided by forming a respective row of memory openings 49 therethrough. Remaining portions of the isolation dielectric rails 2R comprise separator insulator structures 22, which are separator structures including an insulating material. In one embodiment, the separator insulator structures 22 may comprise isolation dielectric pillars 22 which are elongated in a horizontal direction, as shown in FIG. 7B. Laterally alternating sequences of the memory openings 49 and the isolation dielectric pillars 22 are formed. Each alternating stack (32, 42) of insulating layers 32 and sacrificial material layers 42 can include a respective set of insulating layers 32 and a respective set of sacrificial material layers 42 that are vertically stacked with interlacing. In one embodiment, each of the insulating layers 32 and each of the sacrificial material layers 42 in each alternating stack (32, 42) can comprise a respective plate portion (located in the staircase region 300) and a respective set of multiple finger regions (located in the memory array region 100) that protrude laterally from the plate portion along the first horizontal direction hd1. The presence of the memory openings 49 causes a width modulation within each of the finger regions. The width modulation can have minima in the width (e.g., along the second horizontal direction hd2) around the memory openings 49. Each of the insulating layers 32 and the sacrificial material layers 42 can have alternating sequences of planar sidewall sections and concave sidewall sections, which are portions of sidewalls of the memory openings 49.

Referring to FIGS. 8A and 8B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

A silicon oxide liner 551', an aluminum oxide liner 552, a tunneling dielectric layer 56, and a first semiconductor channel material layer 601L can be sequentially deposited.

The silicon oxide liner 551' includes silicon oxide such as undoped silicate glass or a doped silicate glass, and can be deposited by a conformal deposition method such as low pressure chemical vapor deposition. The thickness of the silicon oxide liner 551' can be in a range from 3 nm to 12 nm, although lesser and greater thicknesses can also be employed.

The aluminum oxide liner 552 can have a thickness in a range from 0.1 nm to 2 nm, such as from 0.3 nm to 1 nm, although lesser and greater thicknesses can also be employed. The aluminum oxide liner 552 can be deposited by a conformal deposition method such as atomic layer deposition (ALD).

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The first semiconductor channel material layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel material layer 601L includes amorphous silicon or polysilicon. The first semiconductor channel material layer 601L can be formed by a conformal deposition method such as low pressure chemical vapor deposition (LPCVD). The thickness of the first semiconductor channel material layer 601L can be in a range from 2 nm to 10 nm, although lesser and greater thicknesses can also be employed. A memory cavity 49' is formed in the volume of each memory opening 49 that is not filled with the deposited material layers (551', 552, 56, 601L).

Referring to FIGS. 9A and 9B, the first semiconductor channel material layer 601L, the tunneling dielectric layer 56, the aluminum oxide liner 552, and the silicon oxide liner 551' are sequentially anisotropically etched employing at least one anisotropic etch process. The portions of the first semiconductor channel material layer 601L, the tunneling dielectric layer 56, the aluminum oxide liner 552, and the silicon oxide liner 551' located above the alternating stacks (32, 42) can be removed by the at least one anisotropic etch process. Further, the horizontal portions of the first semiconductor channel material layer 601L, the tunneling dielectric layer 56, the aluminum oxide liner 552, and the silicon oxide liner 551 at a bottom of each memory cavity 49' can be removed to form openings in remaining portions thereof. Each of the first semiconductor channel material layer 601L, the tunneling dielectric layer 56, the aluminum oxide liner 552, and the silicon oxide liner 551 can be etched by a respective anisotropic etch process employing a respective etch chemistry, which may, or may not, be the same for the various material layers.

Each remaining portion of the first semiconductor channel material layer 601L constitutes a first semiconductor channel layer 601. Each first semiconductor channel layer 601 can have a tubular configuration. A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the aluminum oxide liner 552, and the silicon oxide liner 551. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance.

Referring to FIGS. 11A and 11B, in case the memory cavity 49' in each memory opening is not completely filled by the second semiconductor channel material layer 602L, a dielectric core layer can be deposited in the memory cavity 49' to fill any remaining portion of the memory cavity 49' within each memory opening. The dielectric core layer includes a dielectric material such as silicon oxide or organosilicate glass. The dielectric core layer can be deposited by a conformal deposition method such as low pressure chemical vapor deposition (LPCVD), or by a self-planarizing deposition process such as spin coating.

The horizontal portion of the dielectric core layer can be removed, for example, by a recess etch from above the top surface of the alternating stacks (32, 42). The remaining portions of the dielectric core layer can be vertically recessed such that recessed surfaces of the remaining portions of the dielectric core layer are located between a first horizontal plane including the top surfaces of the topmost insulating layers 32 and a second horizontal plane including the bottom surfaces of the topmost insulating layers 32. Each remaining portion of the dielectric core layer constitutes a dielectric core 62.

Further, the horizontal portion of the second semiconductor channel material layer 602L located above the top surface of the topmost insulating layer 32 can be removed by a planarization process, which can employ a recess etch or chemical mechanical planarization (CMP). Each remaining portion of the second semiconductor channel material layer 602L can be located entirety within a memory opening 49 or entirely within a support opening 19. Each remaining portion of the second semiconductor channel material layer 602L in a memory opening 49 is herein referred to as a second semiconductor channel layer 602. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on.

Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the topmost insulating layers 32, for example, by chemical mechanical planarization (CMP) or a recess etch to form the drain regions 63.

A set of all material portions filling a memory opening 49 constitutes a memory opening fill structure 58. Each memory opening fill structure 58 can include a pedestal channel portion 11, a silicon oxide liner 551', an aluminum oxide liner 552, a tunneling dielectric layer 56, and a vertical semiconductor channel 60, a dielectric core 62, and a drain region 63. Each support opening 19 can be filled with a respective set of material portions during formation of the memory opening fill structures 58. Each set of material portions that fills a support opening is herein referred to as a support pillar structure.

Generally, laterally alternating sequences of memory opening fill structures 58 and isolation dielectric pillars 22 can be formed through the vertically alternating sequence (32L, 42L). Remaining portions of the vertically alternating sequence (32L, 42L) include alternating stacks of insulating layers 32 and sacrificial material layers 42 laterally spaced apart by the laterally alternating sequences (58, 22). Each of the memory opening fill structures 58 comprises, from inside to outside, a vertical semiconductor channel 60, a tunneling dielectric layer 56, an aluminum oxide liner 552, and a silicon oxide liner 551' that contacts an outer sidewall of the aluminum oxide liner 552.

Figure 12:
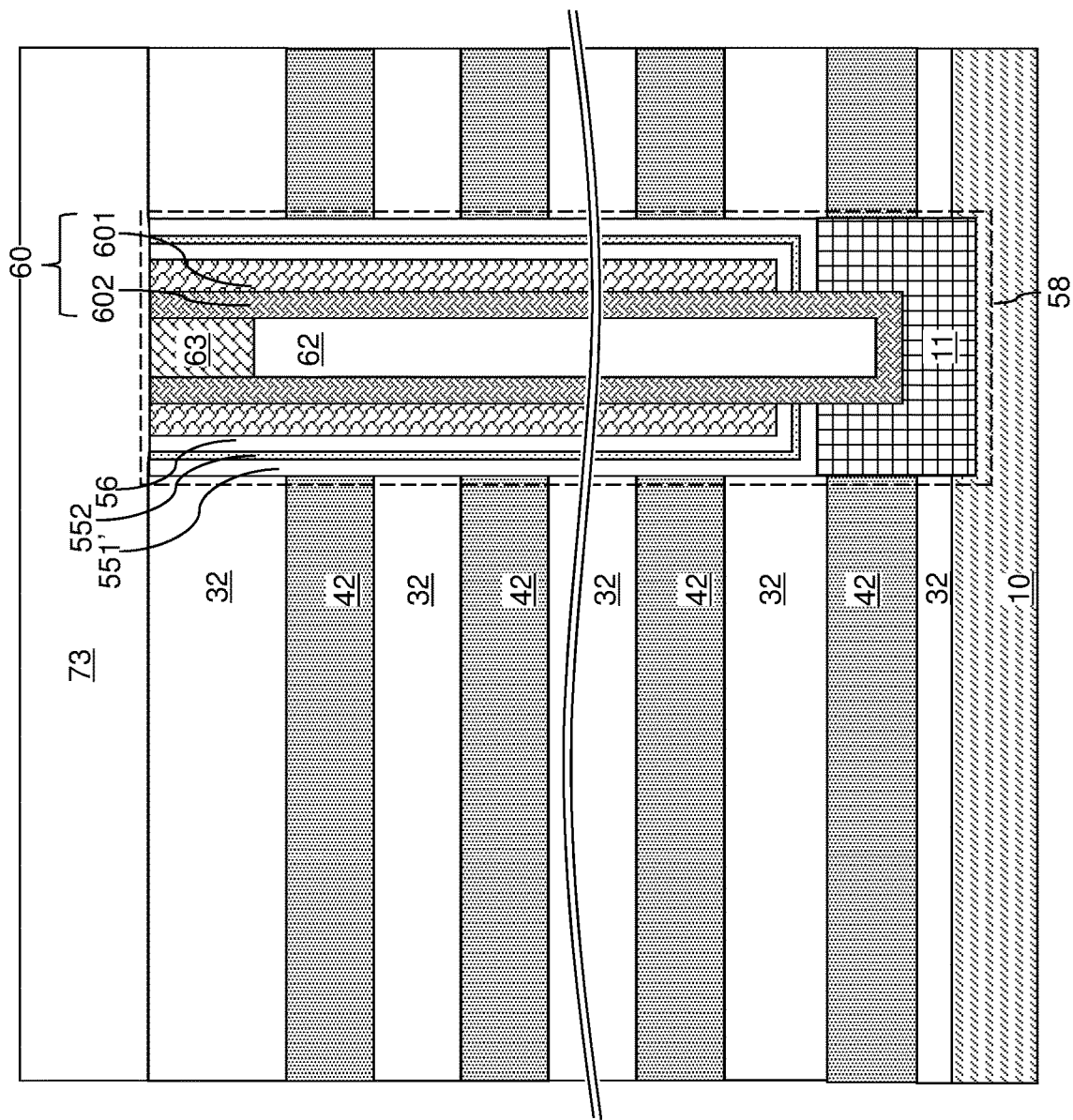
FIG. 12 is a vertical cross-sectional view of a region including a memory opening fill structure after formation of a contact level dielectric layer according to an embodiment of the present disclosure.

Referring to FIG. 12, a contact level dielectric layer 73 can be formed over the alternating stack (32, 42) of insulating layer 32 and sacrificial material layers 42, and over the memory opening fill structures 58. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

Figure 13A:
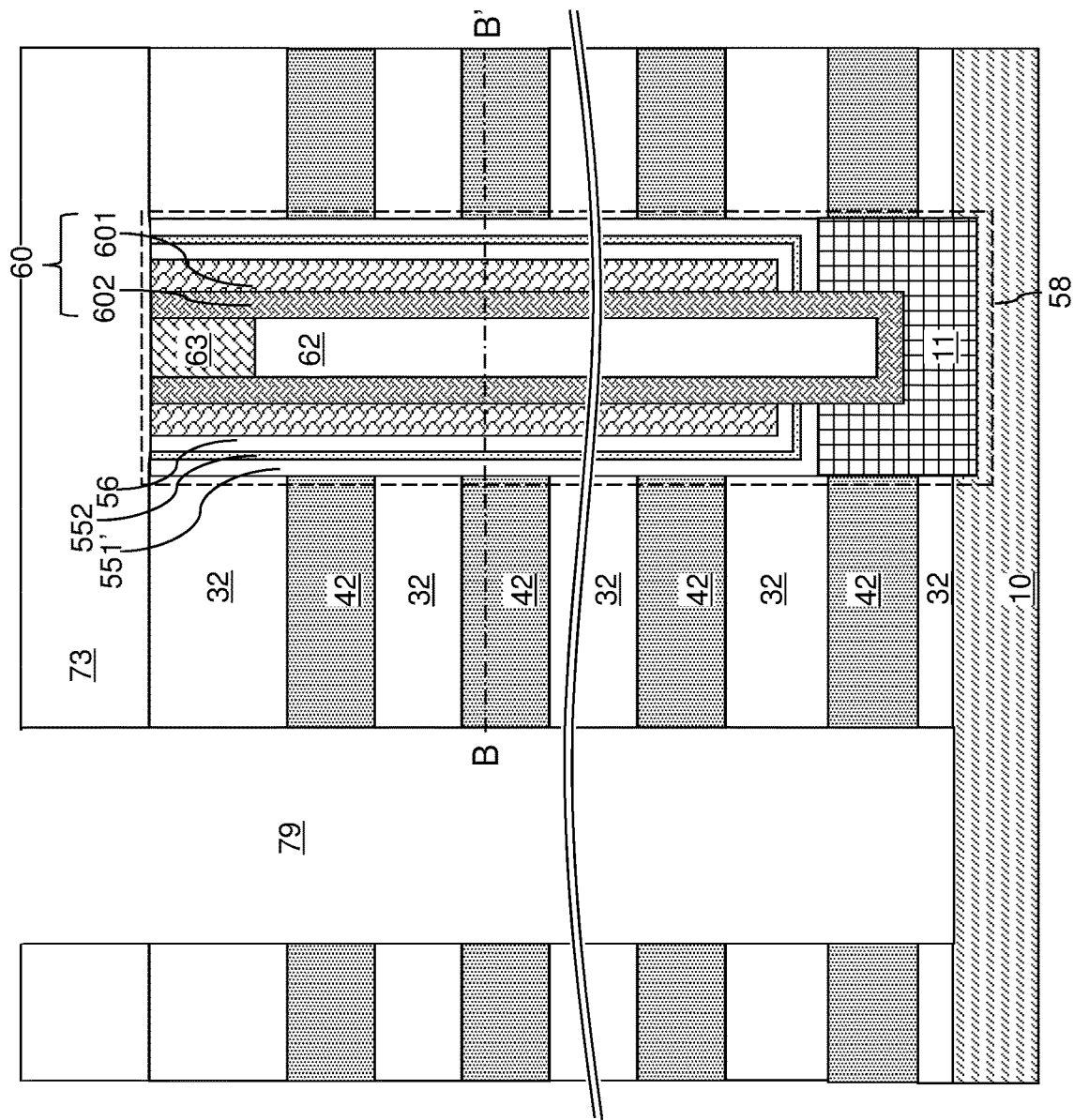
FIG. 13A is a vertical cross-sectional view of a region including a memory opening fill structure and a backside trench after formation of backside trenches according to an embodiment of the present disclosure.
Figure 13B:
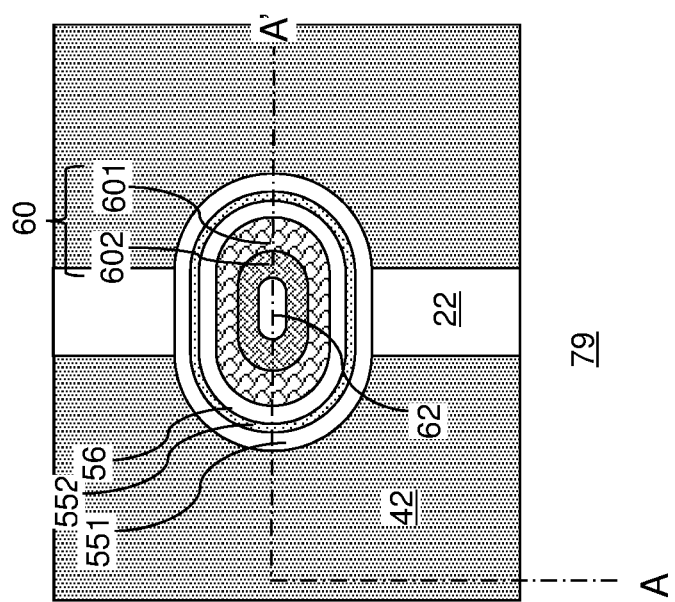
FIG. 13B is a horizontal cross-sectional view along the horizontal plane B-B' of FIG. 13A. The hinged vertical plane A-A' is the plane of the vertical cross-sectional view of FIG. 13A.
Figure 13C:
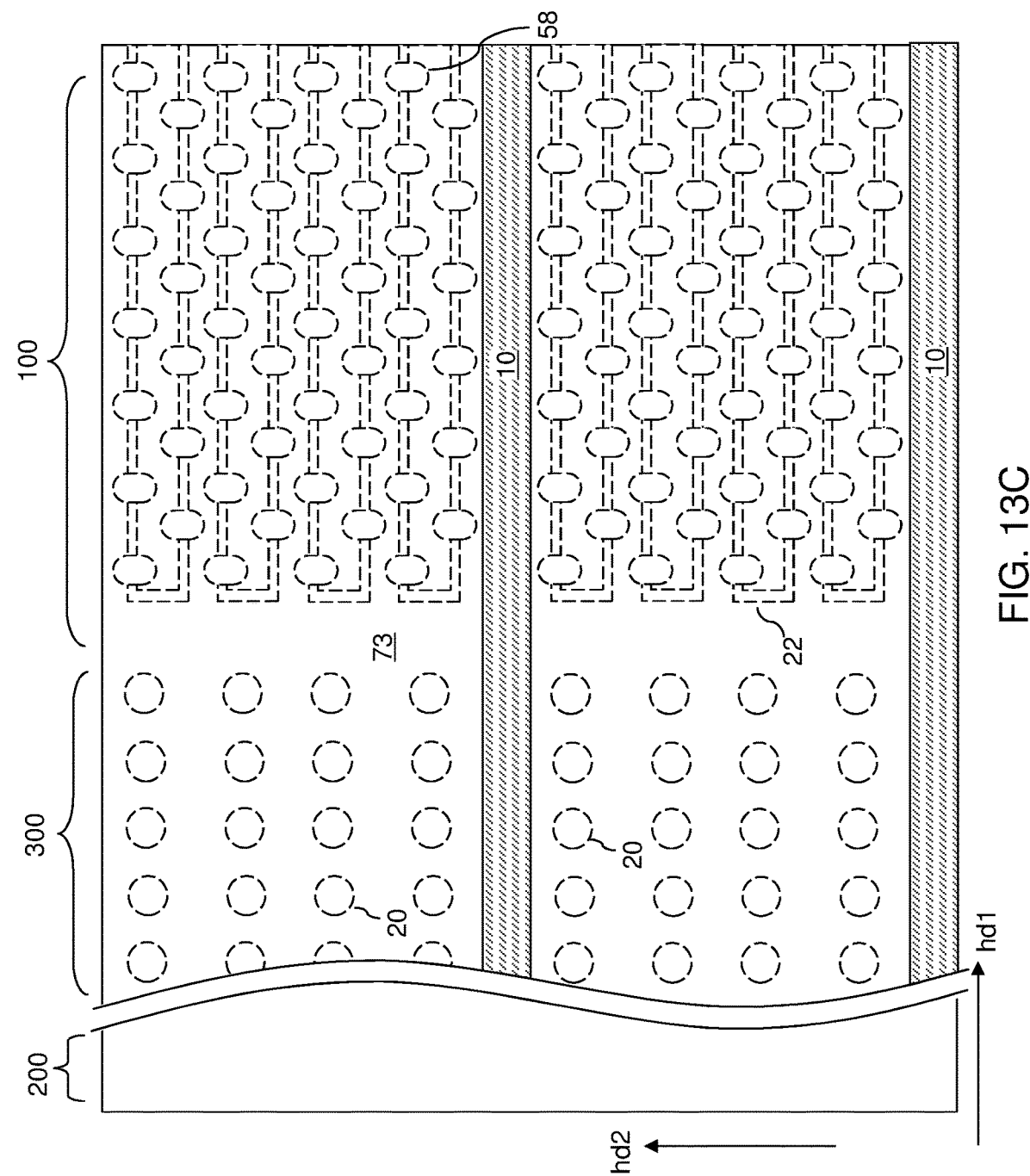
FIG. 13C is a top-down view of the exemplary structure at the processing steps of FIGS. 13A and 13B.

Referring to FIGS. 13A-13C, a photoresist layer (not shown) can be applied over the contact level dielectric layer 73, and is lithographically patterned to form openings in areas between clusters of memory opening fill structures 58. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300. The backside trenches 79 can be formed in areas in which the memory opening fill structures 58 and the support pillar structures 20 are not present. Generally, the backside trenches 79 can be formed through the laterally alternating sequences of memory opening fill structures 58 and isolation dielectric pillars 22 employing an anisotropic etch process. In one embodiment, the patterns of the sacrificial material layers 42 can be selected such that each sacrificial material 42 includes at least one sidewall that is physically exposed to one of the backside trenches 79.

In one embodiment, the backside trenches 79 can laterally extend along a first horizontal direction hd1 and can be laterally spaced apart among one another along a second horizontal direction hd2 that is perpendicular to the first horizontal direction hd1. The memory opening fill structures 58 can be arranged in rows that extend along the first horizontal direction hd1. Each backside trench 79 can have a uniform width that is invariant along the lengthwise direction (i.e., along the first horizontal direction hd1). In one embodiment, the backside trenches 79 can include a source contact opening in which a source contact via structure can be subsequently formed. The photoresist layer can be removed, for example, by ashing.

Figure 14A:
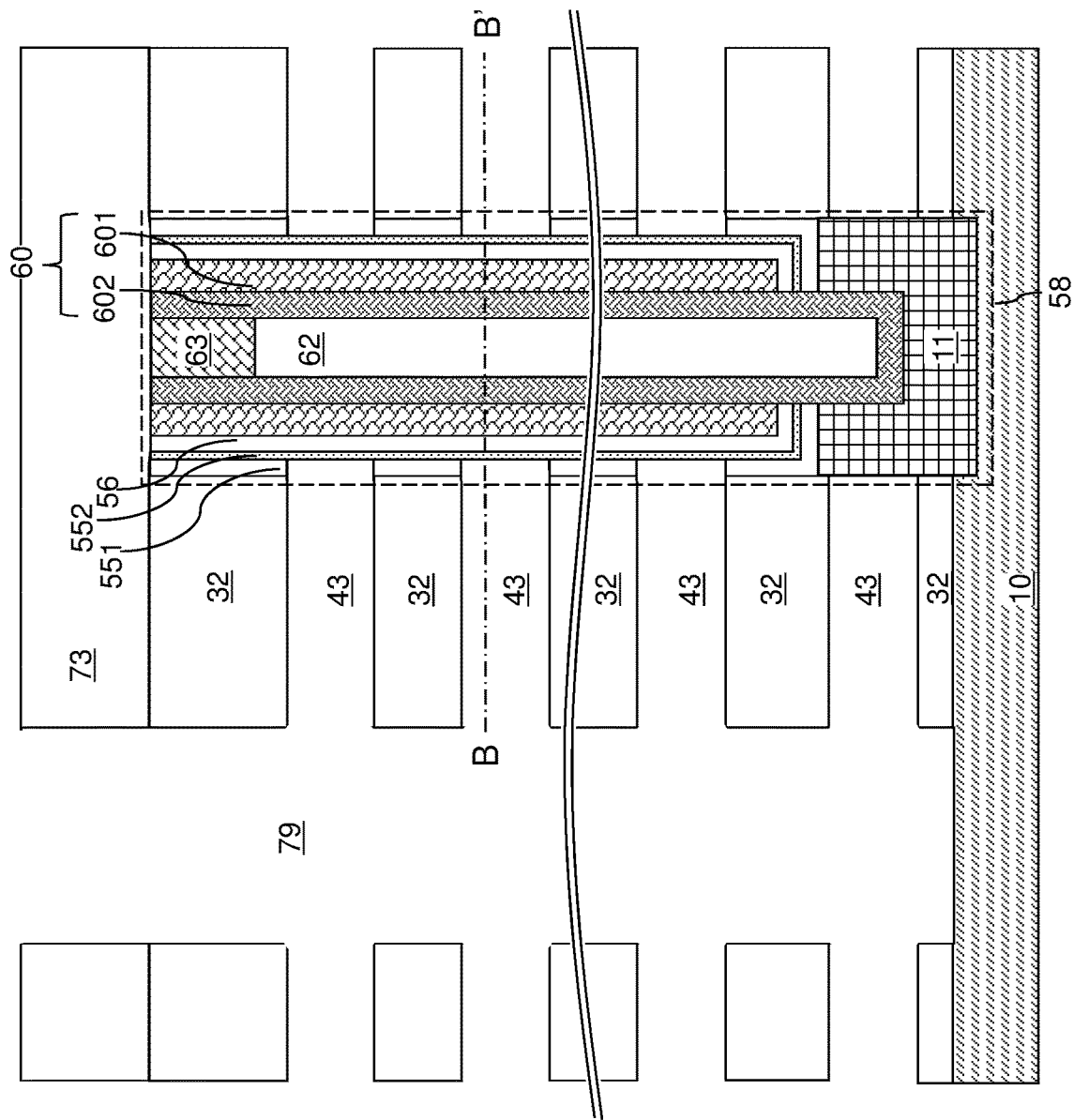
FIG. 14A is a vertical cross-sectional view of a region including a memory opening fill structure and a backside trench after formation of backside recesses according to an embodiment of the present disclosure.
Figure 14B:
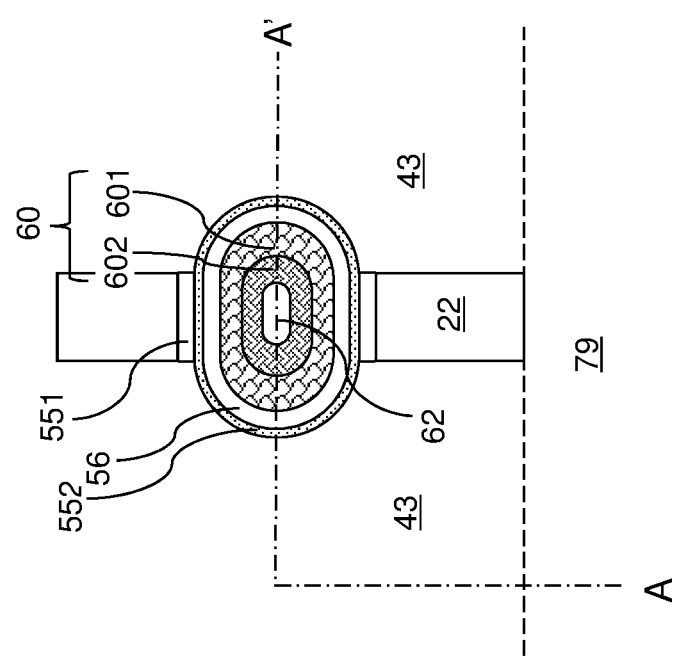
FIG. 14B is a horizontal cross-sectional view along the horizontal plane B-B' of FIG. 14A. The hinged vertical plane A-A' is the plane of the vertical cross-sectional view of FIG. 14A.

Referring to FIGS. 14A and 14B, an isotropic etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the silicon oxide liner 551', i.e., silicon oxide. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the silicon oxide liner 551' can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory opening fill structures 58 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory opening fill structures 58 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Figure 15:
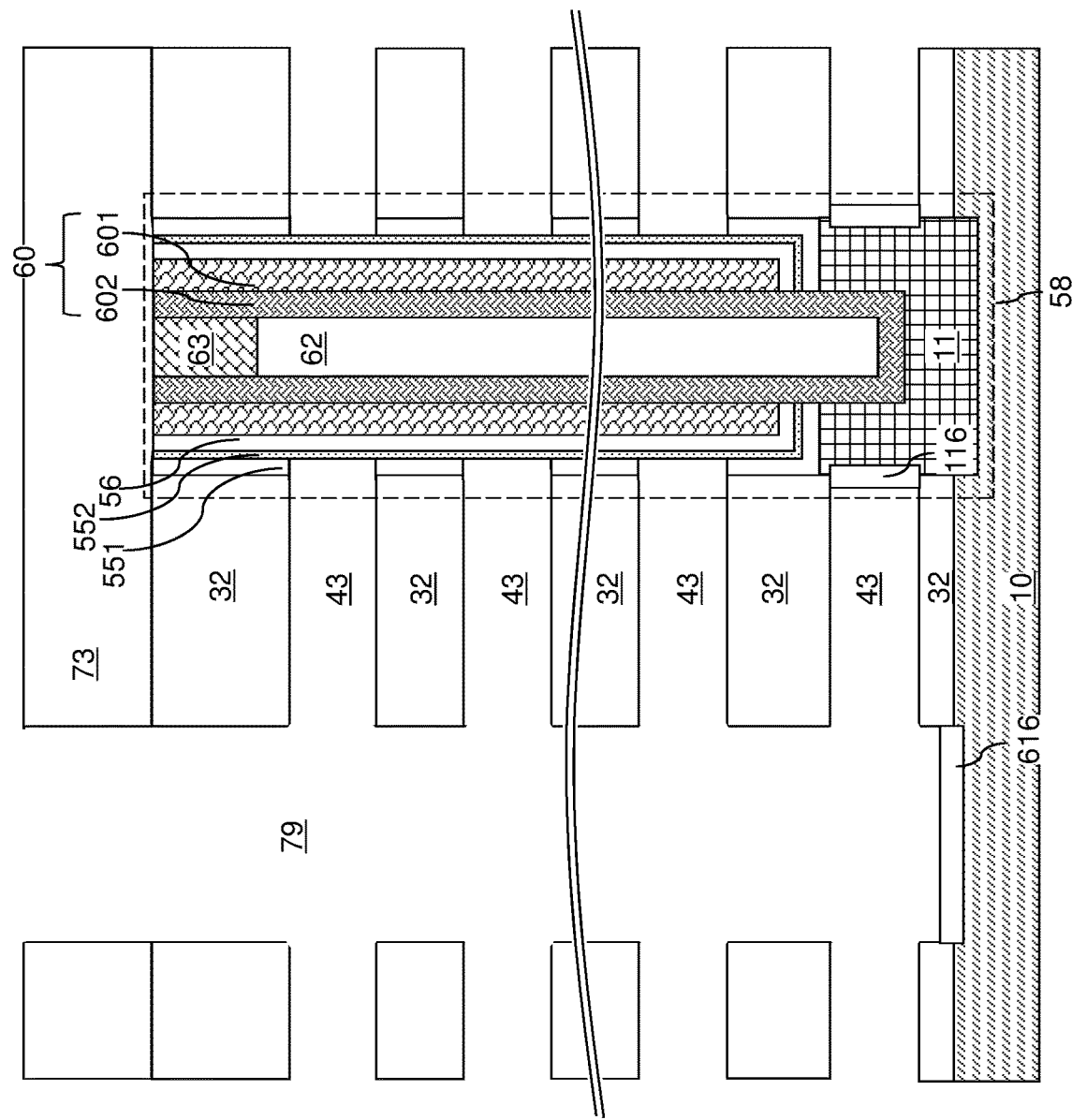
FIG. 15 is a vertical cross-sectional view of a region including a memory opening fill structure and a backside trench after formation of openings through the silicon oxide liner according to an embodiment of the present disclosure.

Referring to FIG. 15, an isotropic etchant that etches the silicon oxide material of the silicon oxide liners 551' can be introduced into the backside trenches 79 and the backside recesses 43 in an isotropic etch process. Openings are formed through each portion of the silicon oxide liners 551' that are exposed to the isotropic etchant. The backside recesses 43 are laterally expanded by formation of openings through the silicon oxide liners 551'. In one embodiment, two vertical stacks of openings can be formed through each silicon oxide liner 551' to provide perforated silicon oxide liners 551. Each perforated silicon oxide liner 551 includes a respective first stack of openings through a perforated silicon oxide liner 551 that faces one direction, and a second stack of openings through the perforated silicon oxide liner 551 that faces the opposite direction.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Figure 16A:
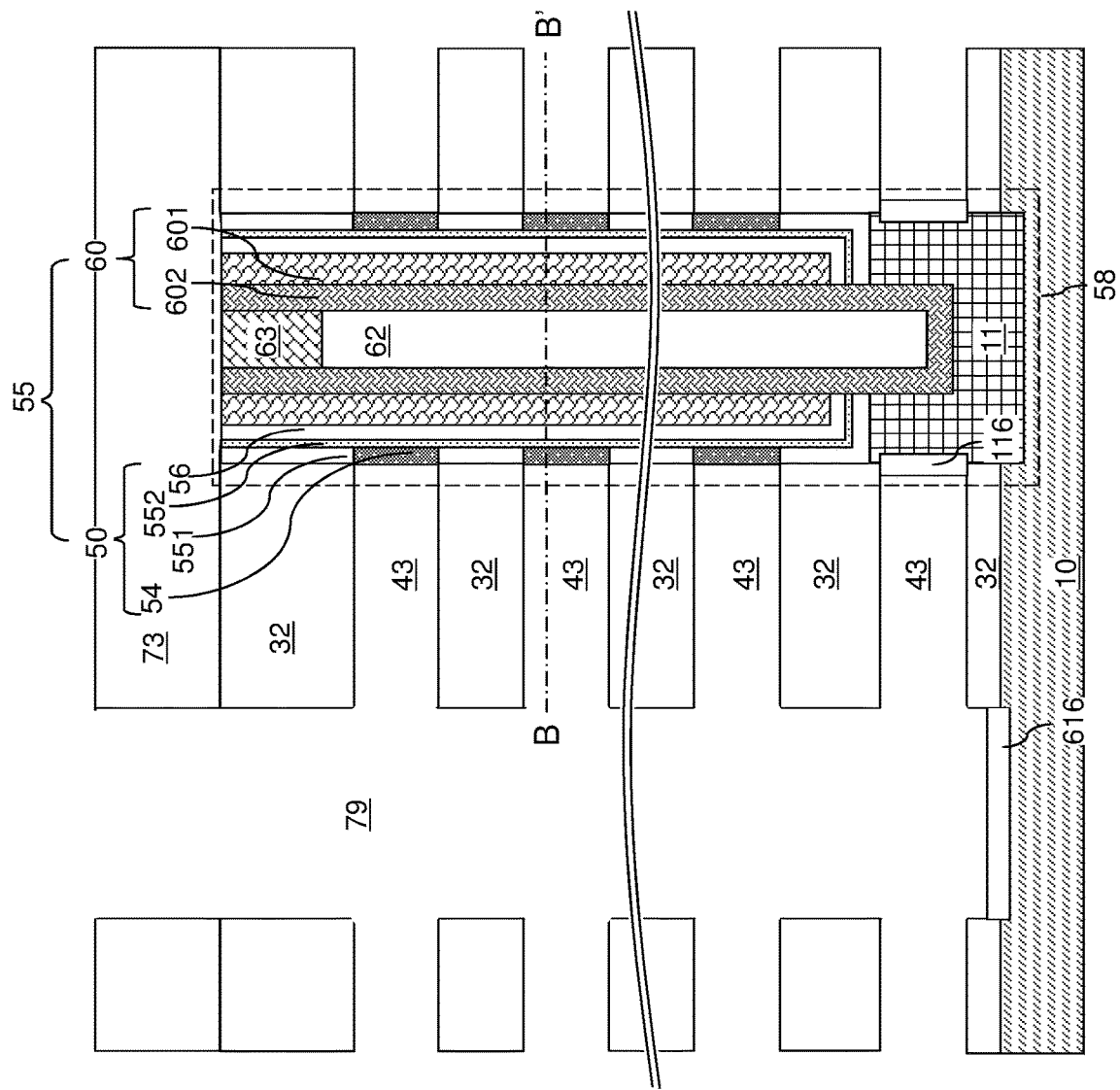
FIG. 16A is a vertical cross-sectional view of a region including a memory opening fill structure and a backside trench after formation of discrete silicon nitride portions according to a first embodiment of the present disclosure.
Figure 16B:
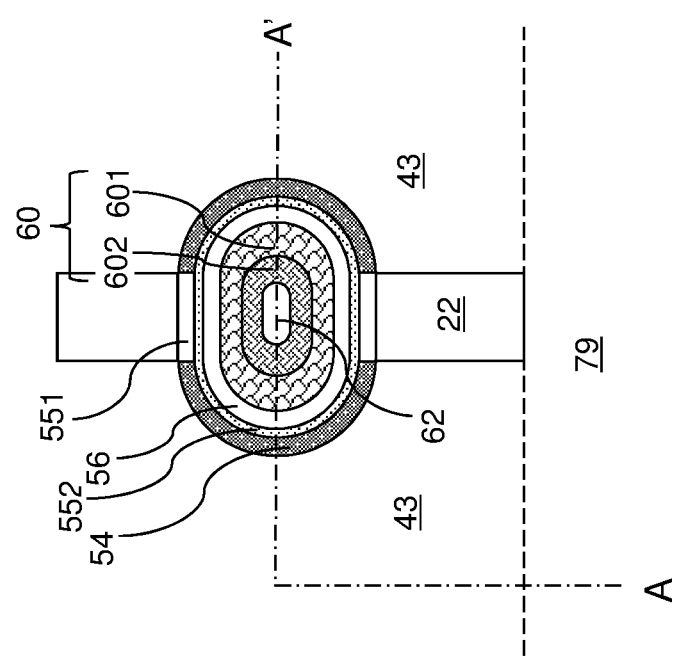
FIG. 16B is a horizontal cross-sectional view along the horizontal plane B-B' of FIG. 16A. The hinged vertical plane A-A' is the plane of the vertical cross-sectional view of FIG. 16A.

Referring to FIGS. 16A and 16B, discrete silicon nitride portions 54 can be formed on physically exposed surfaces of the aluminum oxide liners 552 employing at least one selective silicon nitride deposition process. As used herein, a selective silicon nitride deposition process is a silicon nitride deposition process that deposits silicon nitride on one type of surfaces at a greater deposition rate and/or with a shorter incubation time than on another type of surfaces. Specifically, the at least one selective silicon nitride deposition process can deposit silicon on physically exposed portions of the aluminum oxide liners 552 than on physically exposed surfaces of the insulating layers 32 and the contact level dielectric layer 73. For example, the perforated silicon oxide liner 551, the insulating layers 32, and the contact level dielectric layer 73 can include silicon oxide, and the at least one selective silicon nitride deposition process can include a low pressure chemical vapor deposition (LPCVD) process that deposits silicon nitride. The discrete silicon nitride portions 54 function as discrete charge storage elements (i.e., charge trap elements or portions) for each NAND string. Two vertical stacks of discrete silicon nitride portions 54 can be formed on each memory opening fill structure 58, and are incorporated into a respective memory opening fill structure 58.

In an illustrative example, the LPCVD process that deposits silicon nitride can employ ammonia and at least one silicon-containing gas such as dichlorosilane and silane as reactant gases. The discrete silicon nitride portions are formed through the openings in the silicon oxide liners. The "incubation time" of a deposition process refers to the duration of time between commencement of supply of reactant gases and commencement of deposition of a material derived from decomposition of the reactant gases. The incubation time for silicon nitride deposition on an aluminum oxide surface is shorter than the incubation time for silicon nitride deposition on silicon oxide surfaces. For example, the incubation time for silicon nitride deposition on aluminum oxide surfaces can be in a range from 0 second to 10 seconds (such as from 0 second to 3 seconds), and the incubation time for silicon nitride deposition on silicon oxide surfaces can be in a range from 3 seconds to 60 seconds (such as from 6 seconds to 20 seconds).

In some embodiments, the discrete silicon nitride portions 54 can be formed by performing at least twice a sequence of processing steps. The sequence of processing steps includes a first step of depositing silicon nitride material on aluminum oxide surfaces or on silicon nitride surfaces with a greater thickness than on surfaces of silicon oxide materials through difference in incubation times, and a second step of etching the silicon nitride material employing an etch process. The surfaces of silicon oxide are physically exposed by removing a thin silicon nitride material portion, and portions of the silicon nitride material deposited in the first step remain at least partially after the etch process on the underlying aluminum oxide surfaces.

Each contiguous combination of a tunneling dielectric layer 56, an aluminum oxide liner 552, a perforate silicon oxide liner 551, and two vertical stacks of discrete silicon nitride portions 54 constitutes a memory film 50. Each contiguous combination of a memory film 50 and a vertical semiconductor channel 60 constitutes a memory stack structure 55.

Figure 17B:
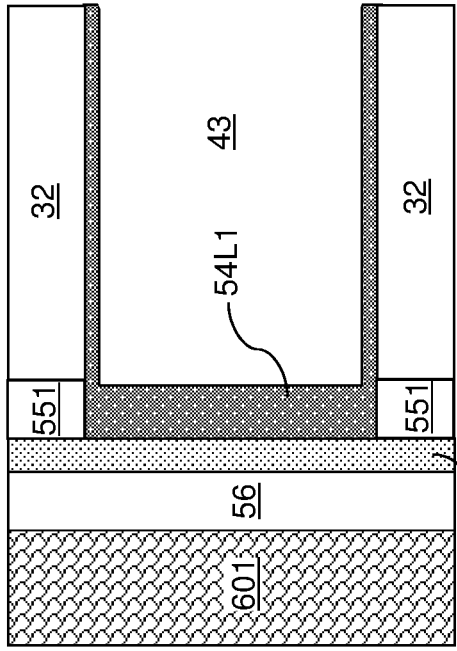
Figure 17D:
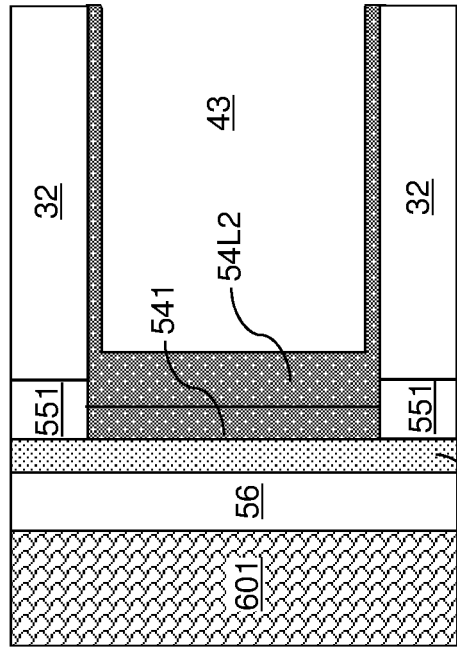
Figure 17A:
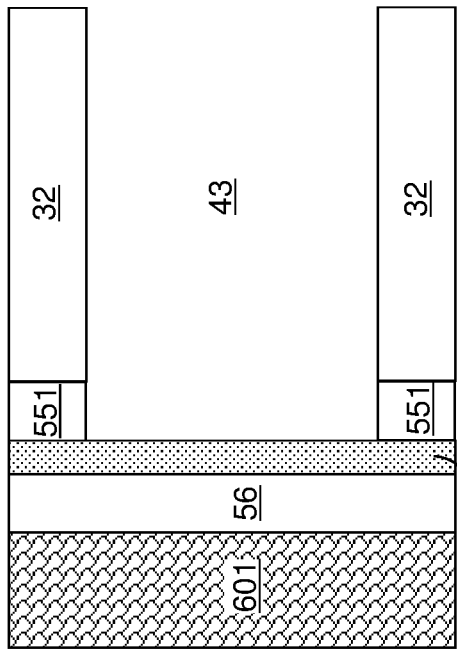

FIGS. 17A-17G illustrate a region around a backside recess 43 during formation of a discrete silicon nitride portion during the processing steps of FIGS. 16A and 16B. FIG. 17A illustrates a backside recess 43 at the processing steps of FIG. 15.

FIG. 17B illustrates a region including a backside recess 43 after a first silicon nitride deposition step that forms a first silicon nitride layer 54L1. Due to the differences in the incubation times, the portion of the first silicon nitride layer 54L1 on the aluminum oxide liner 552 is thicker than the portion of the first silicon nitride layer 54L1 on the insulating layers 32. The difference between the thickness of the vertical portion of the first silicon nitride layer 54L1 on the aluminum oxide liner 552 and the thickness of the horizontal portions of the first silicon nitride layer 54L1 can be in a range from 0.5 nm to 4 nm, such as from 1 nm to 2 nm.

Figure 17C:
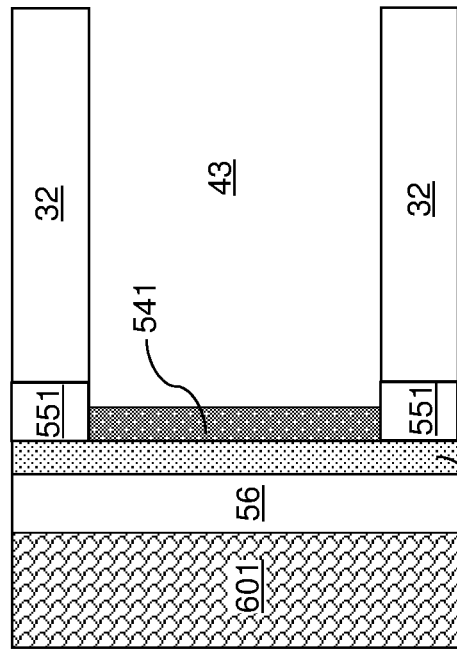

Referring to FIG. 17C, an isotropic etch process is performed to remove the horizontal portions of the first silicon nitride layer 54L1 from the surfaces of the insulating layers 32. Vertical portions of the first silicon nitride layer 54L1 grown on the aluminum oxide liner 552 is partially recessed during the isotropic etch process. The isotropic etch process can be a wet etch process or a dry etch process such as chemical downstream etch process. The remaining portion of the first silicon nitride layer 54L1 constitutes a first silicon nitride segment 541.

Referring to FIG. 17D, a second silicon nitride deposition step is performed to form a second silicon nitride layer 54L2. Due to the differences in the incubation times, the portion of the second silicon nitride layer 54L2 on the first silicon nitride segment 541 is thicker than the portion of the second silicon nitride layer 54L2 on the insulating layers 32. The difference between the thickness of the vertical portion of the second silicon nitride layer 54L2 on the first silicon nitride segment 541 and the thickness of the horizontal portions of the second silicon nitride layer 54L2 can be in a range from 0.5 nm to 4 nm, such as from 1 nm to 2 nm.

Referring to FIG. 17E, an isotropic etch process is performed to remove the horizontal portions of the second silicon nitride layer 54L2 from the surfaces of the insulating layers 32. Vertical portions of the second silicon nitride layer 54L2 grown on the first silicon nitride segment 541 is partially recessed during the isotropic etch process. The isotropic etch process can be a wet etch process or a dry etch process such as chemical downstream etch process. The remaining portion of the second silicon nitride layer 54L2 constitutes a second silicon nitride segment 542 that contacts an outer sidewall of the first silicon nitride segment 541.

Referring to FIG. 17F, a third silicon nitride deposition step is performed to form a third silicon nitride layer 54L3. Due to the differences in the incubation times, the portion of the third silicon nitride layer 54L3 on the second silicon nitride segment 542 is thicker than the portion of the third silicon nitride layer 54L3 on the insulating layers 32. The difference between the thickness of the vertical portion of the third silicon nitride layer 54L3 on the second silicon nitride segment 542 and the thickness of the horizontal portions of the third silicon nitride layer 54L3 can be in a range from 0.5 nm to 4 nm, such as from 2 nm to 3 nm.

Referring to FIG. 17G, an isotropic etch process is performed to remove the horizontal portions of the third silicon nitride layer 54L3 from the surfaces of the insulating layers 32. Vertical portions of the third silicon nitride layer 54L3 grown on the second silicon nitride segment 542 is partially recessed during the isotropic etch process. The isotropic etch process can be a wet etch process or a dry etch process such as chemical downstream etch process. The remaining portion of the third silicon nitride layer 54L3 constitutes a third silicon nitride segment 543 that contacts an outer sidewall of the second silicon nitride segment 542.

The first silicon nitride segment 541, the second silicon nitride segment 542, and the third silicon nitride segment 543 collectively constitutes one of the discrete silicon nitride portions 54 illustrated in FIGS. 16A and 16B. While FIGS. 17A-17G illustrate an embodiment in which a discrete silicon nitride portion 54 is formed by three repetitions of a sequence of processing steps including a first step of depositing silicon nitride material and a second step of etching the silicon nitride material, embodiments are contemplated herein in which the sequence of processing steps including the first step of depositing silicon nitride material and the second step of etching the silicon nitride material is performed once, twice, four times, five times, or more. Further, an embodiment is expressly contemplated herein in which a single silicon nitride deposition step is employed without any etch back process. In this case, the duration of the silicon nitride deposition process can be longer than the incubation time for silicon nitride deposition on an aluminum oxide surface and shorter than the incubation time for silicon nitride deposition on a silicon oxide surface. The thickness of the discrete silicon nitride portions 54 can be in a range from 1 nm to 8 nm, such as from 2 nm to 4 nm, although lesser and greater thicknesses can also be employed.

Figure 18A:
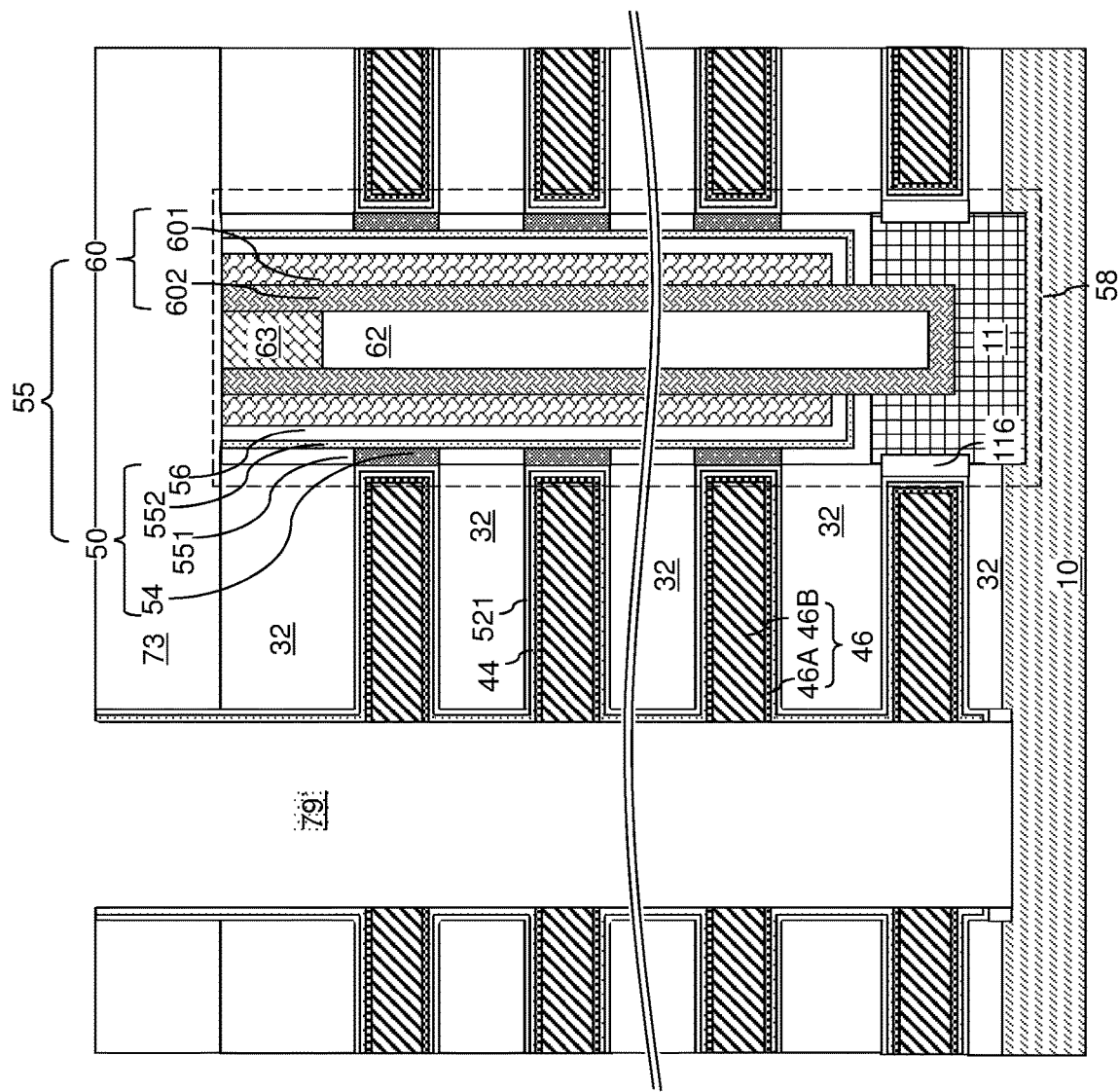
FIG. 18A is a vertical cross-sectional view of region including a memory opening fill structure and a backside trench after formation of a silicon oxide backside blocking dielectric layer, a metal oxide backside blocking dielectric layer, and electrically conductive layers according to the first embodiment of the present disclosure.
Figure 18B:
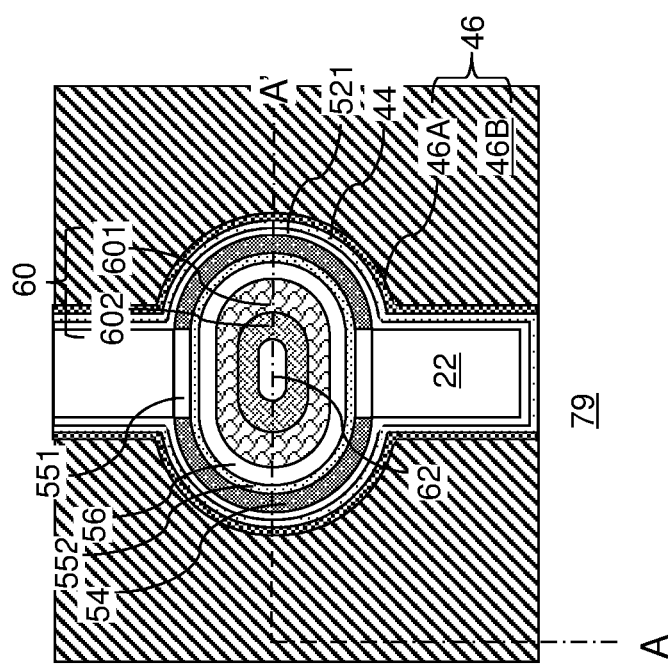
FIG. 18B is a horizontal cross-sectional view along the horizontal plane B-B' of FIG. 18A. The hinged vertical plane A-A' is the plane of the vertical cross-sectional view of FIG. 18A.

Referring to FIGS. 18A and 18B and according to a first embodiment of the present disclosure, a silicon oxide backside blocking dielectric layer 521 can be deposited on the surfaces of the discrete silicon nitride portions 54 and physically exposed surfaces of the insulating layers 32 and the contact level dielectric layer 73. The silicon oxide backside blocking dielectric layer 521 is formed on outer sidewalls of the discrete silicon nitride portions 54. The silicon oxide backside blocking dielectric layer 521 can be deposited by a conformal deposition process such as low pressure chemical vapor deposition. The thickness of the silicon oxide backside blocking dielectric layer 521 can be in a range from 1 nm to 12 nm, such as from 2 nm to 6 nm, although lesser and greater thicknesses can also be employed.

A metal oxide backside blocking dielectric layer 44 can be subsequently formed on the silicon oxide backside blocking dielectric layer 521 by a conformal deposition process. The metal oxide backside blocking dielectric layer 44 includes a metal oxide dielectric material such as aluminum oxide. In one embodiment, the metal oxide backside blocking dielectric layer 44 can be formed by a conformal deposition process such as atomic layer deposition (ALD). The metal oxide backside blocking dielectric layer 44 can consist essentially of aluminum oxide. The thickness of the metal oxide backside blocking dielectric layer 44 can be in a range from 1 nm to 15 nm, such as 2 to 6 nm, although lesser and greater thicknesses can also be employed.

At least one conductive material can be conformally deposited in remaining portions of the backside recesses 43, thereby filling remaining volumes of the backside recesses 43. In one embodiment, the at least one conductive material can include a metallic barrier layer 46A and a metallic fill material 46B. The metallic barrier layer 46A includes an electrically conductive metallic material that can function as a diffusion barrier layer and/or adhesion promotion layer for the metallic fill material 46B to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

The metal fill material 46B can be deposited on the metallic barrier layer 46A. The metallic fill material 46B can be deposited by a conformal deposition method, which can be, for example, chemical vapor deposition (CVD), atomic layer deposition (ALD), electroless plating, electroplating, or a combination thereof. In one embodiment, the metallic fill material 46B can consist essentially of at least one elemental metal. The at least one elemental metal may be selected, for example, from tungsten, cobalt, ruthenium, titanium, and tantalum. In one embodiment, the metallic fill material 46B can consist essentially of a single elemental metal. In one embodiment, the metallic fill material 46B can be deposited employing a fluorine-containing precursor gas such as $WF_6$. In one embodiment, the metallic fill material 46B can include a tungsten layer including a residual level of fluorine atoms as impurities. The metallic fill material 46B is spaced from the insulating layers 32 and the memory opening fill structures 58 by the metallic barrier layer 46A, which blocks diffusion of fluorine atoms therethrough.

A plurality of electrically conductive layers 46 can be formed in the plurality of backside recesses 43, and a continuous electrically conductive material layer can be formed on the sidewalls of each backside trench 79 and over the contact level dielectric layer 73. Each electrically conductive layer 46 includes a portion of the metallic barrier layer 46A and a portion of the metallic fill material 46B that are located between a vertically neighboring pair of insulating layers 32.

The continuous electrically conductive material layer located over the contact level dielectric layer 73 and within the backside trenches 79 can be removed by an etch back process, which may employ an anisotropic etch process or an isotropic etch process. Each sacrificial material layer 42 can be replaced with an electrically conductive layer 46. A backside cavity 79' is present in the portion of each backside trench 79 that is not filled with the metal oxide backside blocking dielectric layer 44 and the continuous electrically conductive material layer. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Each of the discrete silicon nitride portions 54 has a homogeneous composition consisting essentially of silicon atoms and nitrogen atoms. The metal oxide backside blocking dielectric layer 44 can be formed on the silicon oxide backside blocking dielectric layer 521. The electrically conductive layers 46 are formed on the metal oxide backside blocking dielectric layer 44.

Each laterally alternating sequence of memory opening fill structures 58 and isolation dielectric pillars 22 can laterally extend along a horizontal direction such as the first horizontal direction hd1. A first vertically alternating stack of first insulating layers 32 and first electrically conductive layers 42 can be formed on one side of each laterally alternating sequence of memory opening fill structures 58 and isolation dielectric pillars 22, and a second vertically alternating stack of second insulating layers 32 and second electrically conductive layers 46 can be formed on an opposite side of each laterally alternating sequence of memory opening fill structures 58 and isolation dielectric pillars 22. The second alternating stack (32, 46) is laterally spaced apart from, and is adjacent to, the first vertically alternating stack (32, 46).

Figure 19A:
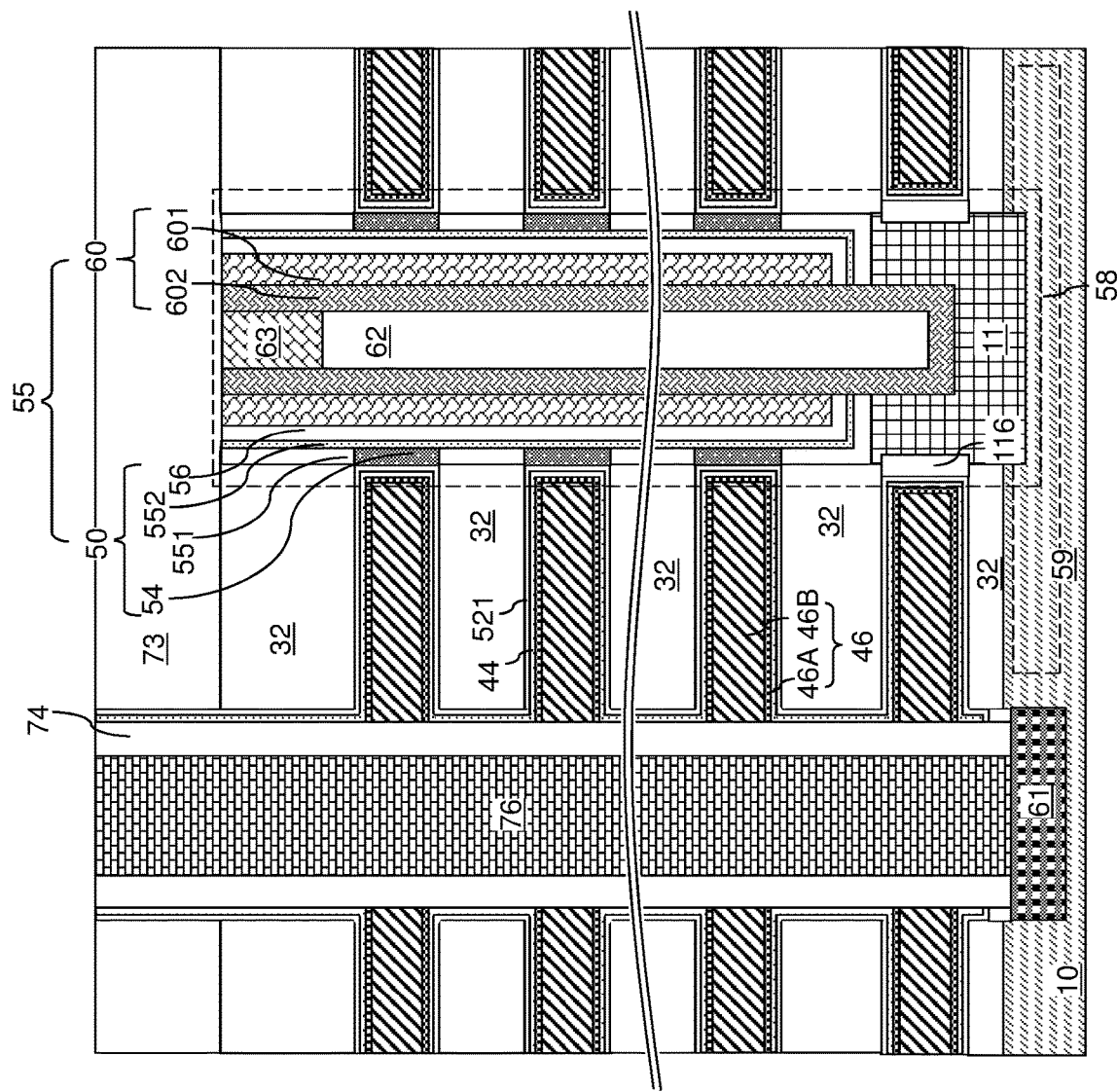
FIG. 19A is a vertical cross-sectional view of region including a memory opening fill structure and a backside trench after formation of source regions and backside contact via structures in the backside trenches according to the first embodiment of the present disclosure.
Figure 19B:
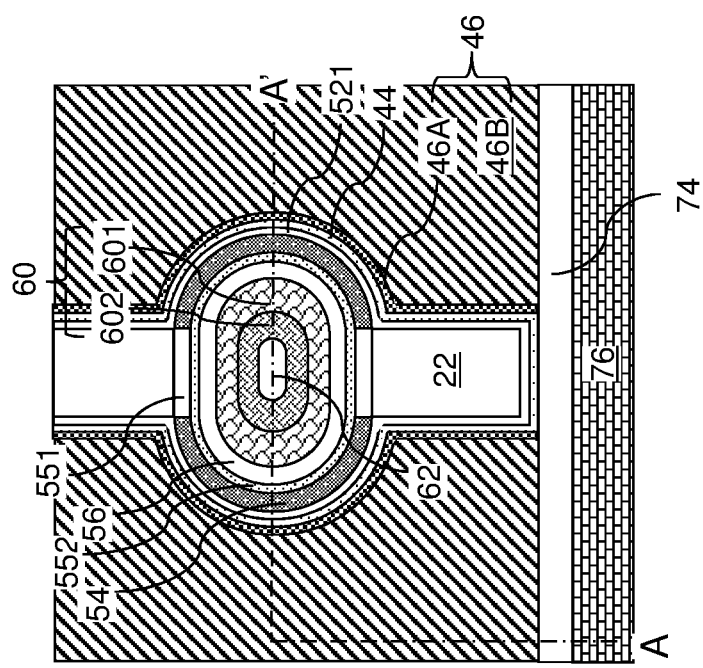
FIG. 19B is a horizontal cross-sectional view along the horizontal plane B-B' of FIG. 19A. The hinged vertical plane A-A' is the plane of the vertical cross-sectional view of FIG. 19A.

Referring to FIGS. 19A and 19B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

The insulating material layer can be formed directly on surfaces of the metal oxide backside blocking dielectric layer 44 and directly on the sidewalls of the electrically conductive layers 46. An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory opening fill structures 58.

A backside contact via structure 76 can be formed within each backside cavity 79'. Each contact via structure 76 can fill a respective backside cavity 79'. The backside contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 20:
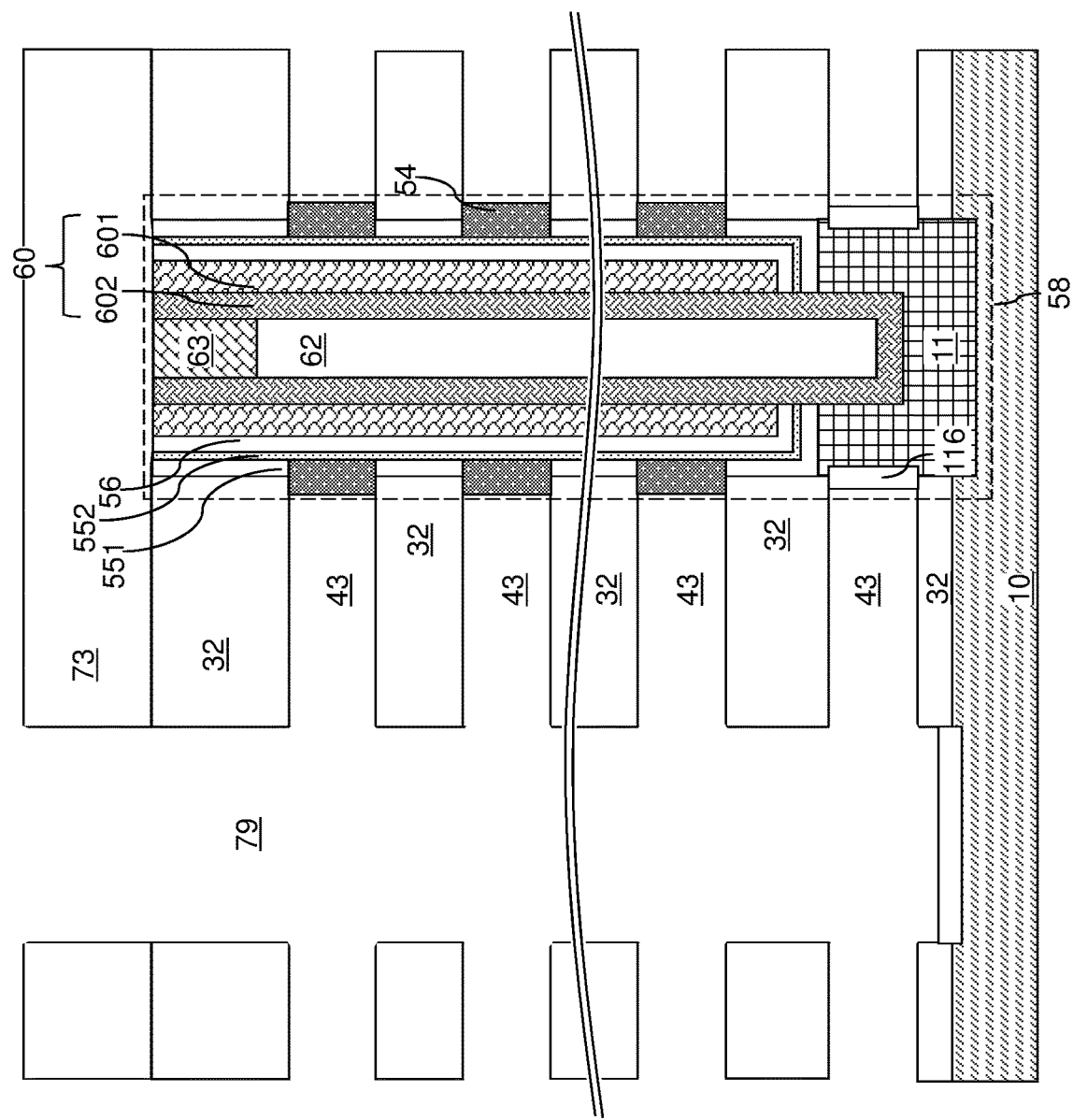
FIG. 20 is a vertical cross-sectional view of a region including a memory opening fill structure and a backside trench after formation of discrete silicon nitride portions according to a second embodiment of the present disclosure.

Referring to FIG. 20, a region of an exemplary structure according to a second embodiment of the present disclosure is illustrated, which can be derived from the exemplary structure of FIGS. 16A and 16B be forming the discrete silicon nitride portions 54 with a greater thickness. The thickness of the discrete silicon nitride portions 54 can be controlled by adjusting the number of repetitions of the sequence of processing steps including a first step of depositing silicon nitride material and a second step of etching the silicon nitride material as illustrated in FIGS. 17A-17G. The thickness of the discrete silicon nitride portions 54 can be in a range from 2 nm to 16 nm, such as from 4 nm to 8 nm, although lesser and greater thicknesses can also be employed.

Figure 21A:
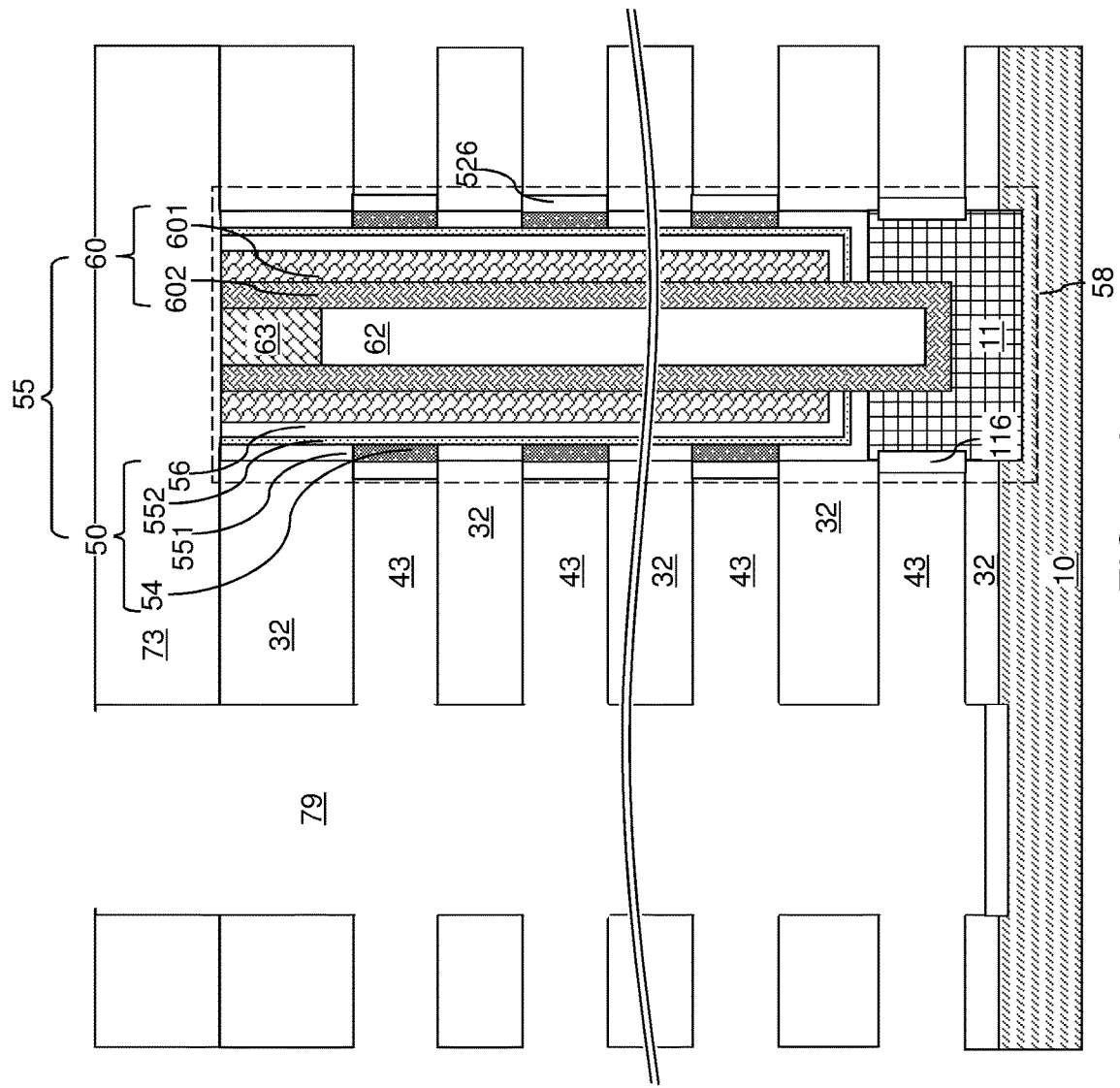
FIG. 21A is a vertical cross-sectional view of region including a memory opening fill structure and a backside trench after conversion of outer portions of the discrete silicon nitride portions into silicon oxide backside blocking dielectric segments according to the second embodiment of the present disclosure.
Figure 21B:
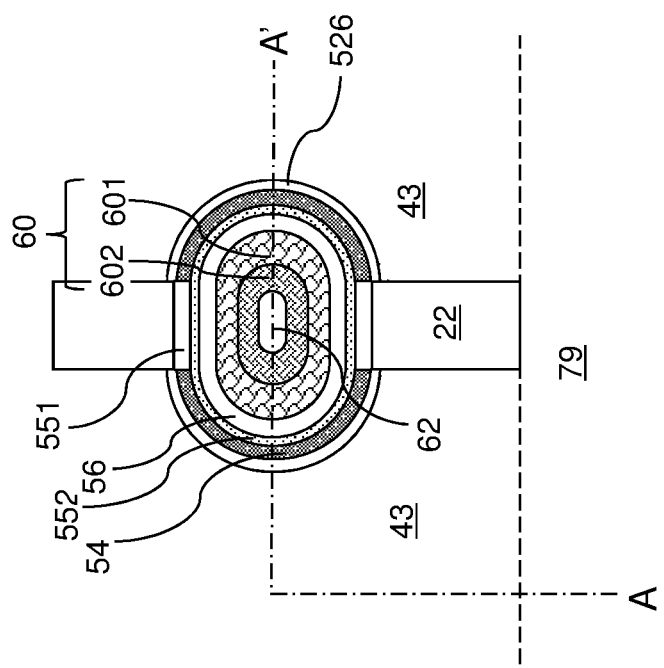
FIG. 21B is a horizontal cross-sectional view along the horizontal plane B-B' of FIG. 21A. The hinged vertical plane A-A' is the plane of the vertical cross-sectional view of FIG. 21A.

Referring to FIGS. 21A and 21B, outer portions of the discrete silicon nitride portions 54 can be converted into silicon oxide backside blocking dielectric segments 526 by an oxidation process. Outer regions of each of the discrete silicon nitride portions 54 can be converted into a respective one of the silicon oxide backside blocking dielectric segments 526. The oxidation process can employ a thermal oxidation process and/or a plasma oxidation process. The thickness of each remaining portion of the discrete silicon nitride portions 54 can be in a range from 1 nm to 8 nm, such as from 2 nm to 4 nm, although lesser and greater thicknesses can also be employed. The thickness of each silicon oxide backside blocking dielectric segment 526 can be in a range from 1 nm to 8 nm, such as from 2 nm to 4 nm, although lesser and greater thicknesses can also be employed.

In one embodiment, each of the discrete silicon nitride portions 54 includes a graded composition region having a lateral compositional gradient such that the oxygen concentration within the graded composition region decreases with a distance from an interface with a silicon oxide backside blocking dielectric segments 526 that the discrete silicon nitride portion 54 contacts. In one embodiment, the discrete silicon nitride portions 54 function as discrete charge storage elements for each NAND string. Two vertical stacks of discrete silicon nitride portions 54 can be formed on, and can be incorporated into, each memory opening fill structure 58.

Figure 22A:
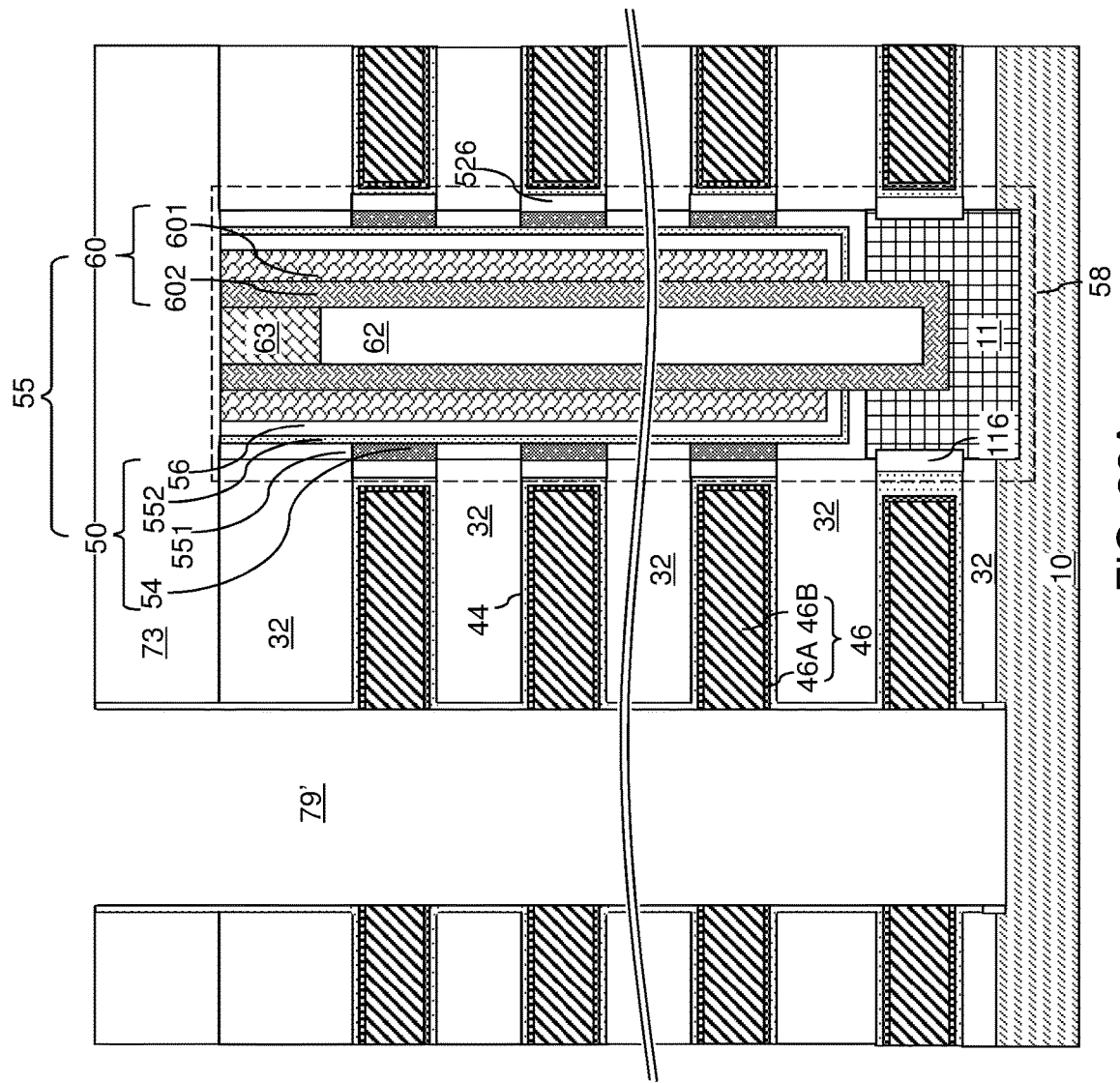
FIG. 22A is a vertical cross-sectional view of region including a memory opening fill structure and a backside trench after formation of a metal oxide backside blocking dielectric layer and electrically conductive layers according to the second embodiment of the present disclosure.
Figure 22B:
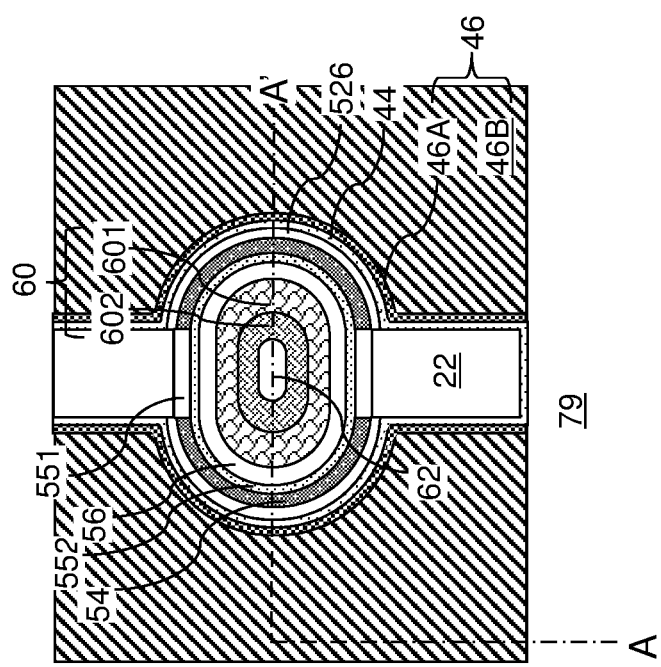
FIG. 22B is a horizontal cross-sectional view along the horizontal plane B-B' of FIG. 22A. The hinged vertical plane A-A' is the plane of the vertical cross-sectional view of FIG. 22A.
Figure 23A:
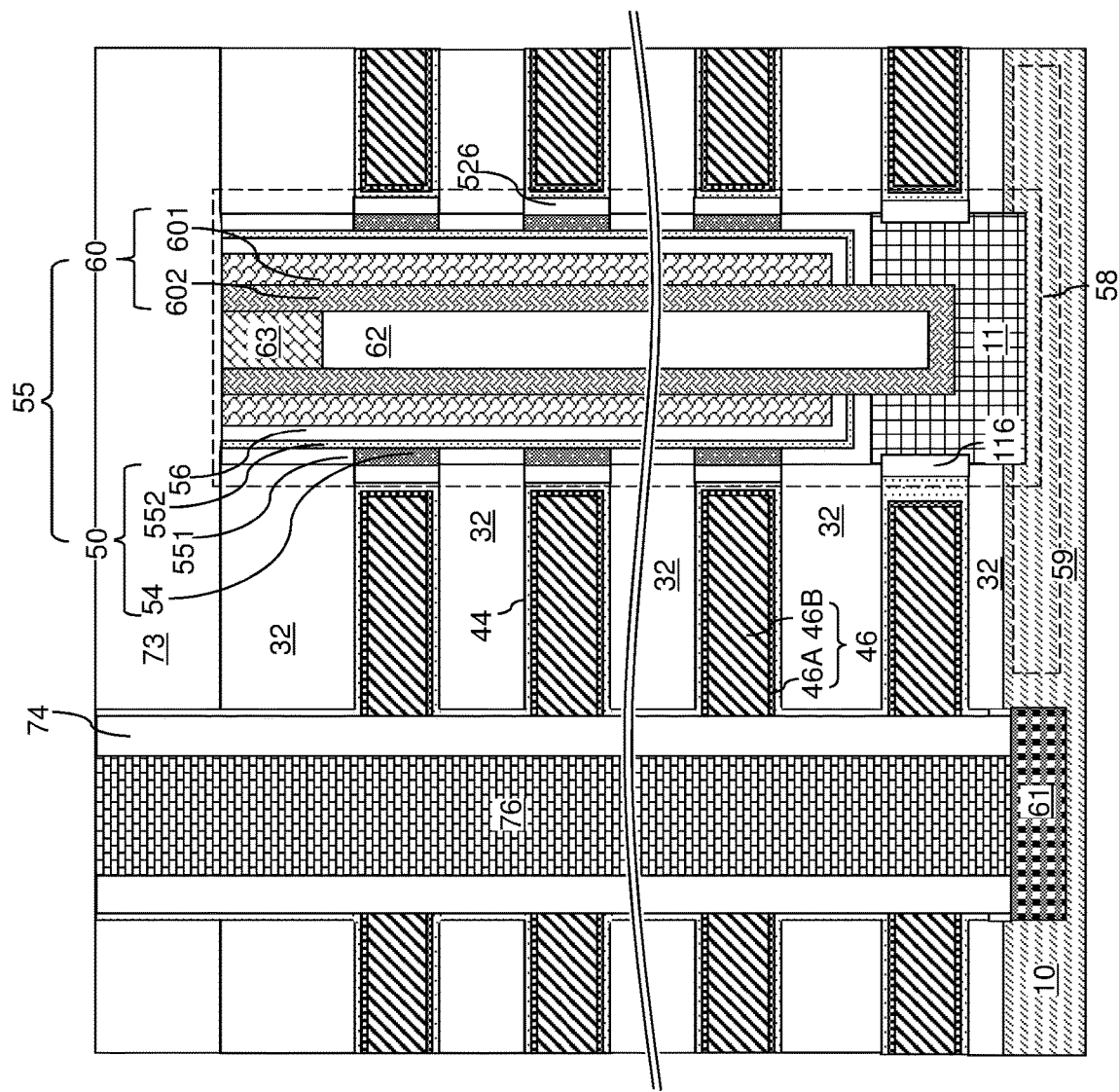
FIG. 23A is a vertical cross-sectional view of region including a memory opening fill structure and a backside trench after formation of source regions and backside contact via structures in the backside trenches according to the second embodiment of the present disclosure.
Figure 23B:
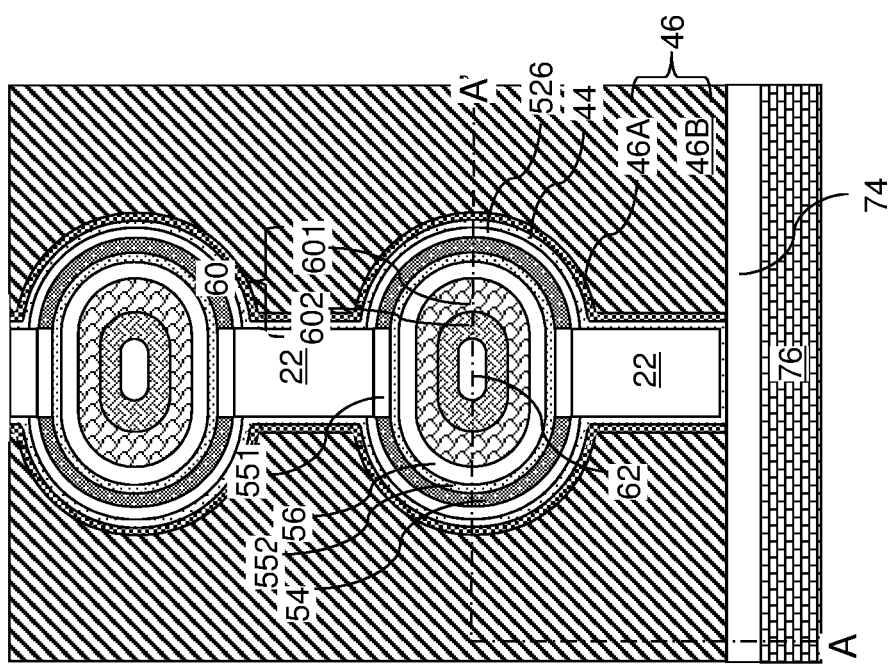
FIG. 23B is a horizontal cross-sectional view along the horizontal plane B-B' of FIG. 23A. The hinged vertical plane A-A' is the plane of the vertical cross-sectional view of FIG. 23A.

Referring to FIGS. 22A and 22B, the processing steps of FIGS. 18A and 18B can be subsequently performed to deposit a metal oxide backside blocking dielectric layer 44 on the silicon oxide backside blocking dielectric segments 526 and the insulating layers 32, and to form electrically conductive layers 46 on the metal oxide backside blocking dielectric layer 44. Formation of a silicon oxide backside blocking dielectric layer 521 (shown in FIGS. 18A and 18B) may be omitted. In this case, the metal oxide backside blocking dielectric layer 44 can be formed on the silicon oxide backside blocking dielectric segments 526. The electrically conductive layers 46 can be formed on the metal oxide backside blocking dielectric layer 44.

Figure 24A:
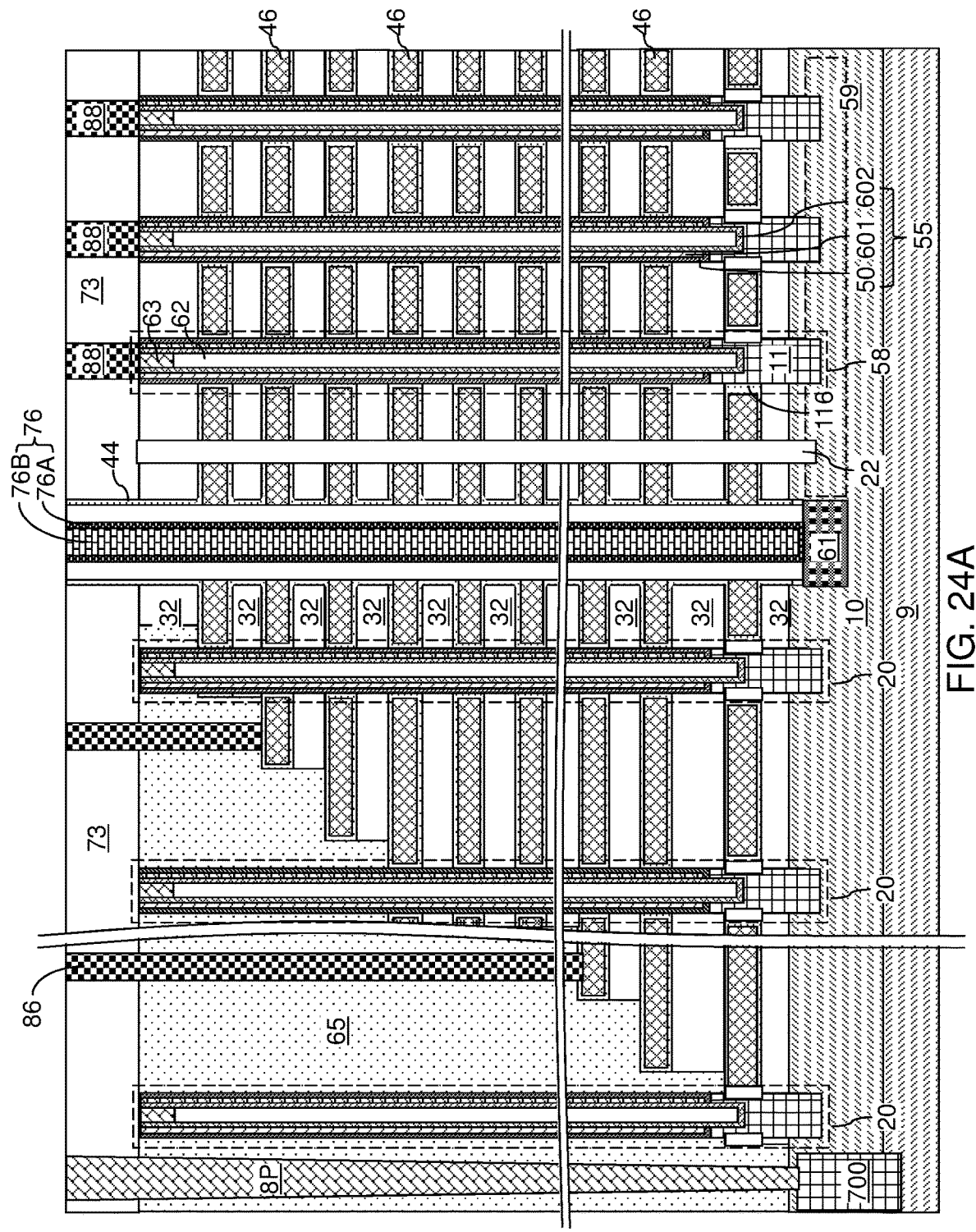
FIG. 24A is a vertical cross-sectional view of the exemplary structure after formation of additional contact via structures according to an embodiment of the present disclosure.
Figure 24B:
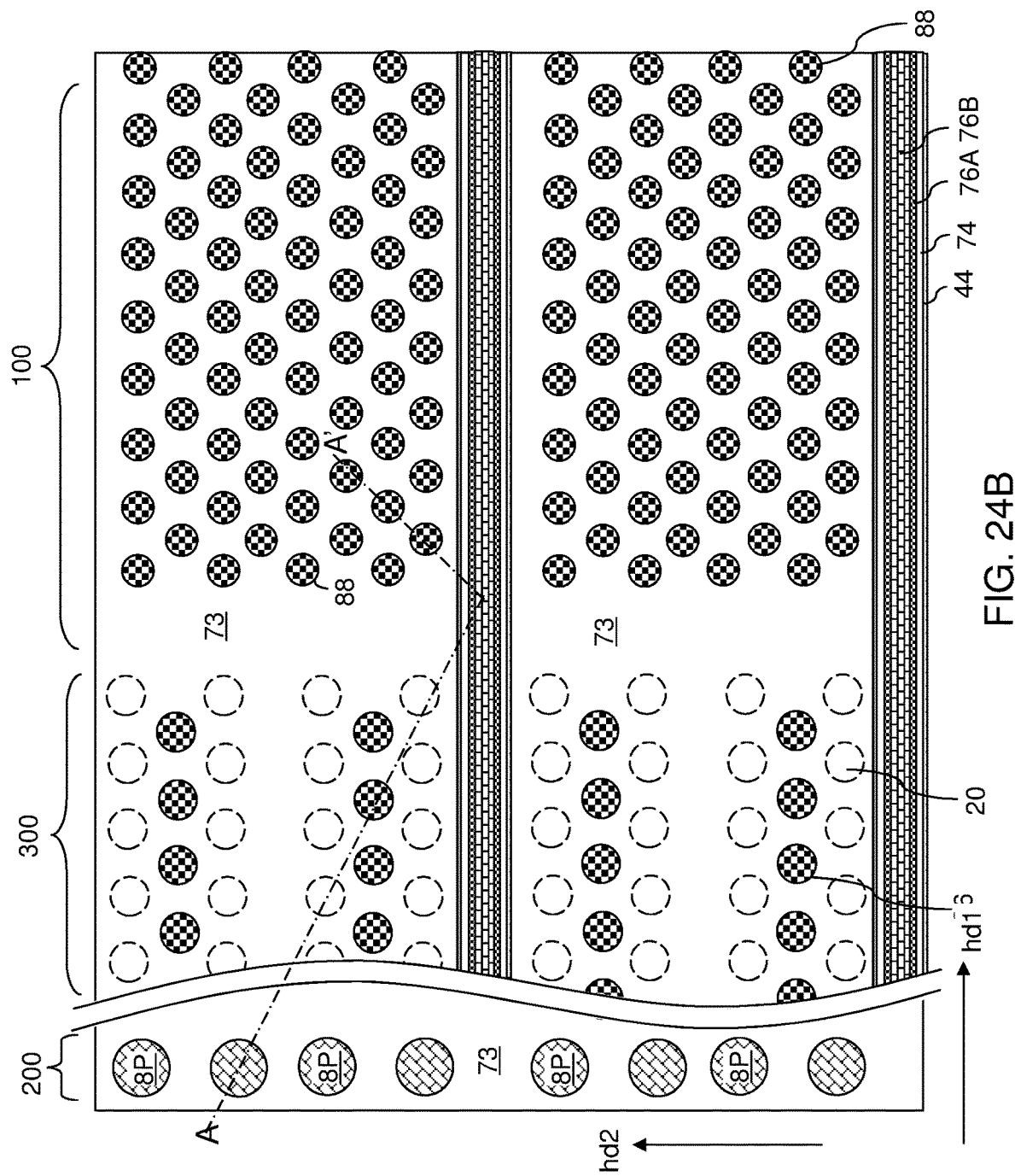
FIG. 24B is a top-down view of the exemplary structure of FIG. 24A. The hinged vertical plane A-A' is the plane of the vertical cross-sectional view of FIG. 24A.

Referring to FIGS. 24A and 24B, the processing steps of FIGS. 19A and 19B can be performed to form source regions 61, insulating spacers 74, and backside contact via structures 76.

Additional processing steps can be performed to the exemplary structure after formation of the backside contact via structures 76 according to all embodiments of the present disclosure. For example, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

Referring to all drawings and according to various embodiments of the present disclosure, a three-dimensional memory device is provided, which comprises: a first vertically alternating stack of first insulating layers 32 and first electrically conductive layers 46 located over a substrate (9, 10); a second vertically alternating stack of second insulating layers 32 and second electrically conductive layers 46 located over the substrate (9, 10) and laterally spaced apart from, and is adjacent to, the first vertically alternating stack (32, 46); and a laterally alternating sequence of memory opening fill structures 58 and isolation dielectric pillars 22 located between the first vertically alternating stack (32, 46) and the second vertically alternating stack (32, 46), wherein: each of the memory opening fill structures 58 comprises, from inside to outside, a vertical semiconductor channel 60, a tunneling dielectric layer 56, an aluminum oxide liner 522, and two vertical stacks of discrete silicon nitride portions 54; and each pair of discrete silicon nitride portions 54 located at a same height from the substrate (9, 10) and included in the two vertical stacks of discrete silicon nitride portions 54 is vertically spaced apart from all other pairs of discrete silicon nitride portions 54 within a respective memory opening fill structure 58.

In one embodiment, each of the memory opening fill structures 58 further comprises a perforated silicon oxide liner 551 contacting an outer sidewall of the aluminum oxide liner 522 and including two vertical stacks of openings in which the two vertical stacks of discrete silicon nitride portions 54 are located.

In one embodiment, the entirety of the outer sidewall of the aluminum oxide liner 522 is contacted by the perforated silicon oxide liner 551 and the two vertical stacks discrete silicon nitride portions 54.

In one embodiment, the perforated silicon oxide liner 552 contacts sidewalls of the first insulating layers 32, sidewalls of the second insulating layers 32, and sidewalls of two isolation dielectric pillars 22 among the isolation dielectric pillars 22 of the laterally alternating sequence (58, 22).

In one embodiment, the two vertical stacks of discrete silicon nitride portions 54 comprise a first vertical stack of discrete silicon nitride portions 54 and a second vertical stack of discrete silicon nitride portions 54 that is located at each level at which the first vertical stack of discrete silicon nitride portions 54 is present and is laterally spaced apart from the first vertical stack of discrete silicon nitride portions 54.

In one embodiment, the first electrically conductive layers 46 comprise control gate electrodes for the first vertical stack of discrete silicon nitride portions 54; and the second electrically conductive layers 46 comprise control gate electrodes for the second vertical stack of discrete silicon nitride portions 54.

In one embodiment, the three-dimensional memory device comprises: a first metal oxide backside blocking dielectric layer 44 located between each of the first electrically conductive layers 46 and the laterally alternating sequence (58, 22) of memory opening fill structures 58 and isolation dielectric pillars 22; and a second metal oxide backside blocking dielectric layer 44 located between each of the second electrically conductive layers 46 and the laterally alternating sequence (58, 22) of memory opening fill structures 58 and isolation dielectric pillars 22.

In one embodiment, the three-dimensional memory device comprises: a first silicon oxide backside blocking dielectric layer 521 contacting the first metal oxide backside blocking dielectric layer 44, outer sidewalls of the first vertical stack of discrete silicon nitride portions 54, and horizontal surfaces of the first insulating layers 32; and a second silicon oxide backside blocking dielectric layer 521 contacting the second metal oxide backside blocking dielectric layer 44, outer sidewalls of the second vertical stack of discrete silicon nitride portions 54, and horizontal surfaces of the second insulating layers 32. In one embodiment, each of the discrete silicon nitride portions 54 has a homogeneous composition consisting essentially of silicon atoms and nitrogen atoms.

In one embodiment, the three-dimensional memory device comprises: a vertical stack of first silicon oxide backside blocking dielectric segments 526 contacting inner sidewalls of the first metal oxide backside blocking dielectric layer 44 and outer sidewalls of the first vertical stack of discrete silicon nitride portions 54; and a vertical stack of second silicon oxide backside blocking dielectric segments 526 contacting inner sidewalls of the second metal oxide backside blocking dielectric layer 44 and outer sidewalls of the second vertical stack of discrete silicon nitride portions 54.

In on embodiment, each of the discrete silicon nitride portions 54 includes a graded composition region having a lateral compositional gradient such that an oxygen concentration within the graded composition region decreases with a distance from an interface with a respective one of the first silicon oxide backside blocking dielectric segments 526 or with a respective one of the second silicon oxide backside blocking dielectric segments 526.

In one embodiment, each of the isolation dielectric pillars 22 in the laterally alternating sequence (58, 22) contact each of the first insulating layers 32, each of the second insulating layers 32, and the substrate (9, 10).

According to another embodiment, a three-dimensional memory device comprises alternating stacks of insulating layers 32 and electrically conductive layers 46 laterally spaced apart and located over a substrate (9, 10); and laterally alternating sequences of memory stack structures 55 and separator structures, such as the isolation dielectric pillars 22, located between each laterally neighboring pair of the alternating stacks. Each of the memory stack structures 55 comprises, from inside to outside, a vertical semiconductor channel 60, a tunneling dielectric 56 an aluminum oxide liner 522, and two vertical stacks of discrete charge trap silicon nitride portions 54. Each pair of discrete charge trap silicon nitride portions 54 located at a same height from the substrate (9, 10) is vertically spaced from other pairs of discrete charge trap silicon nitride portions 54 and does not directly contact each other. A backside blocking dielectric layer 44 is disposed between each adjacent pair of discrete charge trap silicon nitride portions 54 and an electrically conductive layer 46.

The various embodiments of the present disclosure provide a pair of memory elements at each level of the electrically conductive layers 46. Each pair of memory elements can comprise a pair of discrete silicon nitride portions 54. By forming a pair of discrete memory elements per each level of the electrically conductive layers 46, the number of memory elements within a memory opening fill structure 58 can be doubled. A high three-dimensional density of memory elements can be provided by the various embodiments of the present disclosure.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   a first vertically alternating stack of first insulating layers and first electrically conductive layers located over a substrate;
   a second vertically alternating stack of second insulating layers and second electrically conductive layers located over the substrate and laterally spaced apart from, and adjacent to, the first vertically alternating stack; and
   a laterally alternating sequence of memory opening fill structures and isolation dielectric pillars located between the first vertically alternating stack and the second vertically alternating stack, wherein:
   each of the memory opening fill structures comprises, from inside to outside, a vertical semiconductor channel, a tunneling dielectric layer, an aluminum oxide liner, a perforated silicon oxide liner, and two vertical stacks of discrete silicon nitride portions, wherein the perforated silicon oxide liner comprises a first portion which contacts an outer sidewall of a first side of the aluminum oxide liner adjacent to the first vertically alternating stack and the first portion of the perforated silicon oxide liner includes a first vertical stack of openings through the perforated silicon oxide liner in which one of the two vertical the stacks of discrete silicon nitride portions are located, the perforated silicon oxide liner comprises a second portion which contacts an outer sidewall of a second side of the aluminum oxide liner adjacent to the second vertically alternating stack and the second portion of the perforated silicon oxide liner includes a second vertical stack of openings through the perforated silicon oxide liner in which the other of the two vertical stacks of discrete silicon nitride portions are located, and the perforated silicon oxide liner comprises a third portion between the aluminum oxide liner and the isolation dielectric pillars;
   each pair of discrete silicon nitride portions located at a same height from the substrate and included in the two vertical stacks of discrete silicon nitride portions is vertically spaced apart from all other pairs of discrete silicon nitride portions within a respective memory opening fill structure; and
   a vertical stack of silicon oxide backside blocking dielectric segments on outer sidewalls of the first vertical stack of discrete silicon nitride portions.

2. The three-dimensional memory device of claim 1, wherein an entirety of the outer sidewall of the aluminum oxide liner is contacted by the perforated silicon oxide liner and the two vertical stacks discrete silicon nitride portions.

3. The three-dimensional memory device of claim 1, wherein the perforated silicon oxide liner contacts sidewalls of the first insulating layers, sidewalls of the second insulating layers, and sidewalls of two isolation dielectric pillars among the isolation dielectric pillars of the laterally alternating sequence.

4. The three-dimensional memory device of claim 1, wherein the two vertical stacks of discrete silicon nitride portions comprise a first vertical stack of discrete silicon nitride portions and a second vertical stack of discrete silicon nitride portions that is located at each level at which the first vertical stack of discrete silicon nitride portions is present and is laterally spaced apart from the first vertical stack of discrete silicon nitride portions.

5. The three-dimensional memory device of claim 4, wherein:
   the first electrically conductive layers comprise control gate electrodes for the first vertical stack of discrete silicon nitride portions; and
   the second electrically conductive layers comprise control gate electrodes for the second vertical stack of discrete silicon nitride portions.

6. The three-dimensional memory device of claim 4, further comprising:
   a first metal oxide backside blocking dielectric layer located between each of the first electrically conductive layers and the laterally alternating sequence of memory opening fill structures and isolation dielectric pillars; and
   a second metal oxide backside blocking dielectric layer located between each of the second electrically conductive layers and the laterally alternating sequence of memory opening fill structures and isolation dielectric pillars.

7. The three-dimensional memory device claim 6, wherein the vertical stack of first silicon oxide backside blocking dielectric segments comprise, a vertical stack of first silicon oxide backside blocking dielectric segments contacting inner sidewalls of the first metal oxide backside blocking dielectric layer and outer sidewalls of the first vertical stack of discrete silicon nitride portions; and a vertical stack of second silicon oxide backside blocking dielectric segments contacting inner sidewalls of the second metal oxide backside blocking dielectric layer and outer sidewalls of the second vertical stack of discrete silicon nitride portions, wherein each of the discrete silicon nitride portions includes a graded composition region having a lateral compositional gradient such that an oxygen concentration within the graded composition region decreases with a distance, from an interface with a respective one of the first silicon oxide backside blocking dielectric segments or with a respective one the second silicon oxide backside blocking dielectric segments.

8. The three-dimensional memory device of claim 1, wherein each of the isolation dielectric pillars contact each of the first insulating layers, each of the second insulating layers, and the substrate.

9. The three-dimensional memory device of claim 1, wherein each discrete silicon nitride pardon within the two vertical stacks of silicon nitride pardons comprises an outer sidewall that directly contacts a respective silicon oxide backside blocking dielectric segment of the vertical stack of first silicon oxide backside blocking dielectric segments.

10. The three-dimensional memory device of claim 1, wherein the perforated silicon oxide liner contacts sidewalls of the first insulating layers and the second insulating layers, and does not contact any of the electrically conductive layers.

11. The three-dimensional memory device of claim 1, wherein each discrete silicon nitride portion within the two vertical stacks of silicon nitride portions directly contacts the aluminum oxide liner through a respective opening of the two vertical stacks of discrete openings through the perforated silicon oxide liner.

12. A three-dimensional memory device, comprising:
vertically alternating stacks of insulating layers and electrically conductive layers laterally spaced apart and located over a substrate; and
laterally alternating sequences of memory stack structures and separator structures located between each laterally neighboring pair of the alternating stacks, wherein:
each of the memory stack structures comprises, from inside to outside, a vertical semiconductor channel, a tunneling dielectric, an aluminum oxide liner, a perforated silicon oxide liner, and two vertical stacks of discrete charge trap silicon nitride portions, wherein the perforated silicon oxide liner comprises a first portion which contacts an outer sidewall of a first side of the aluminum oxide liner adjacent to one of the vertically alternating stacks and the first portion of the perforated silicon oxide liner includes a first Vertical stack of openings through the perforated silicon oxide liner in which one of the two vertical the stacks of discrete silicon nitride portions are located, the perforated silicon oxide liner comprises a second portion which contacts an outer sidewall of a second side of the aluminum oxide liner adjacent to another one of vertically alternating stack and the second portion of the perforated silicon oxide liner includes a second vertical stack of openings through the perforated silicon oxide liner in which the other of the two vertical the stacks of discrete silicon nitride portions are located, and the perforated silicon oxide liner comprises a third portion between the aluminum oxide liner and the isolation dielectric pillars;
each pair of discrete charge trap silicon nitride portions located at a same height from the substrate is vertically spaced from other pairs of discrete charge trap silicon nitride portions and does not directly contact each other; and
a vertical stack of silicon oxide backside blocking dielectric segments layer is disposed between each adjacent pair of discrete charge trap silicon nitride portion and an electrically conductive layer.

13. The three-dimensional memory device of claim 9, wherein each discrete silicon nitride portion includes a graded composition region having a lateral compositional gradient such that an oxygen concentration within the graded composition region decreases with a distance from an interface with the respective silicon oxide backside blocking dielectric segments.

14. The three-dimensional memory device of claim 9, wherein each of the silicon oxide backside blocking dielectric segments contacts a bottom surface of an overlying one of the first insulating layers and the second insulating layers, and contacts a top surface of an underlying one of the first insulating layers and the second insulating layers.

15. The three-dimensional memory device of claim 12, wherein each discrete silicon nitride portion within the two vertical stacks of silicon nitride portions comprises an outer sidewall that directly contacts a respective silicon oxide backside blocking dielectric segment of the vertical stack of first silicon oxide backside blocking dielectric segments.

16. The three-dimensional memory device of claim 15, wherein:
each discrete silicon nitride portion includes a graded composition region having a lateral compositional gradient such that an oxygen concentration within the graded composition region decreases with a distance from an interface with the respective silicon oxide backside blocking dielectric segments; and
each of the silicon oxide backside blocking dielectric segments contacts a bottom surface of an overlying one of the first insulating layers and the second insulating layers, and contacts a top surface of an underlying one of the first insulating layers and the second insulating layers.

17. The three-dimensional memory device of claim 12, wherein the perforated silicon oxide liner contacts sidewalls of the first insulating layers and the second insulating layers, and does not contact any of the electrically conductive layers.

18. The three-dimensional memory device of claim 12, wherein each discrete silicon nitride portion within the two vertical stacks of silicon nitride portions directly contacts the aluminum oxide liner through a respective opening of the two vertical stacks of discrete openings through the perforated silicon oxide liner.

* * * * *